United States Patent
Noma

(10) Patent No.: US 10,862,077 B2
(45) Date of Patent: Dec. 8, 2020

(54) METHOD OF PRODUCING DISPLAY DEVICE USING IMPRINT LAYER FORMING STEP

(71) Applicant: Sharp Kabushiki Kaisha, Sakai (JP)

(72) Inventor: Mikihiro Noma, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 2 days.

(21) Appl. No.: 16/398,333

(22) Filed: Apr. 30, 2019

(65) Prior Publication Data

US 2019/0350085 A1 Nov. 14, 2019

(30) Foreign Application Priority Data

May 10, 2018 (JP) .................... 2018-091565

(51) Int. Cl.
| | |
|---|---|
| H01L 51/56 | (2006.01) |
| H05K 3/10 | (2006.01) |
| H01L 27/32 | (2006.01) |
| H05K 3/00 | (2006.01) |
| H05K 1/03 | (2006.01) |
| H01L 51/52 | (2006.01) |
| G06F 3/044 | (2006.01) |
| G06F 3/041 | (2006.01) |
| H01L 51/00 | (2006.01) |

(52) U.S. Cl.
CPC .............. *H01L 51/56* (2013.01); *G06F 3/044* (2013.01); *G06F 3/0412* (2013.01); *H01L 27/323* (2013.01); *H01L 27/3244* (2013.01); *H01L 51/0097* (2013.01); *H01L 51/5281* (2013.01); *H05K 1/0326* (2013.01); *H05K 1/0393* (2013.01); *H05K 3/0047* (2013.01); *H05K 3/107* (2013.01); *G06F 2203/04103* (2013.01); *H01L 2227/323* (2013.01); *H01L 2251/5338* (2013.01)

(58) Field of Classification Search
CPC .... H05K 3/107; H05K 1/0326; H05K 1/0393; H05K 3/0047; G06F 3/0412; G06F 3/044; H01L 27/323; H01L 27/3244; H01L 51/0097; H01L 51/5281; H01L 51/56
See application file for complete search history.

(56) References Cited

U.S. PATENT DOCUMENTS

| | | | |
|---|---|---|---|
| 9,313,887 B2 | 4/2016 | Gao et al. | |
| 2008/0095985 A1* | 4/2008 | Frey ................... | C23F 1/02 428/156 |
| 2012/0306357 A1* | 12/2012 | Yamamoto .......... | H01L 51/0014 313/504 |

(Continued)

FOREIGN PATENT DOCUMENTS

JP 5833260 B2 12/2015

Primary Examiner — Michael Jung
(74) Attorney, Agent, or Firm — Keating & Bennett, LLP

(57) ABSTRACT

A method of producing a substrate includes an imprint layer forming step of forming an imprint layer on a surface of a foundation layer and boring a contact hole through a location in the imprint layer that overlaps at least a part of a foundation conductive layer of the foundation layer, a groove forming step of, by partially depressing a surface of the imprint layer, forming a conductive layer forming groove at least a part of which communicates with the contact hole, and a conductive layer forming step of forming a conductive layer in the conductive layer forming groove and the contact hole.

11 Claims, 14 Drawing Sheets

(56) References Cited

U.S. PATENT DOCUMENTS

2014/0124746 A1* 5/2014 Hwang ............... H01L 29/7869
          257/40
2014/0253827 A1   9/2014 Gao et al.

* cited by examiner

METHOD OF PRODUCING DISPLAY DEVICE USING IMPRINT LAYER FORMING STEP

CROSS REFERENCE TO RELATED APPLICATION

This application claims priority from Japanese Patent Application No. 2018-091565 filed on May 10, 2018. The entire contents of the priority application are incorporated herein by reference.

TECHNICAL FIELD

The technology described herein relates to a method of producing a substrate and a method of producing a display device.

BACKGROUND

Electronic devices such as tablet laptop computers and portable information terminals have recently been becoming mounted with touch panels (touch screens) for the purpose of enhancing operability and usability. A known example of a method of producing a touch panel is disclosed in Japanese Patent No. 5833260. The method of producing a touch screen disclosed in Japanese Patent No. 5833260 includes the steps of: preparing a substrate including a first surface and a second surface opposite to the first surface; applying a gel onto the first surface, solidifying the gel to form a first matrix layer, and defining a first groove on a side of the first matrix layer away from the substrate; filling the first groove with an electrical conducting material; applying a gel to the side of the first matrix layer away from the substrate, solidifying the gel to form a second matrix layer, and defining a second groove in the second matrix layer; and filling the second groove with an electrical conducting material to form a second conductive layer.

The method of producing a touch screen disclosed in Japanese Patent No. 5833260 includes stacking the first matrix layer and the second matrix layer, which are formed by solidifying the respective gels; forming the first groove and the second groove in the first matrix layer and the second matrix layer, respectively, by using a so-called imprint technique; and forming a first conductive layer and the second conductive layer in the respective grooves. However, this method has made it difficult to make a direct electrically continuous connection between the first conductive layer formed in the first matrix layer and the second conductive layer formed in the second matrix layer.

SUMMARY

The technology described herein was made in view of the above circumstances. An object is to electrically continuously connect a wire directly to a foundation conductive layer.

According to an aspect of the technology described herein, there is provided a method of producing a substrate, the method including: an imprint layer forming step of forming an imprint layer on a surface of a foundation layer and boring a contact hole through a location in the imprint layer that overlaps at least a part of a foundation conductive layer of the foundation layer; a groove forming step of, by partially depressing a surface of the imprint layer, forming a conductive layer forming groove at least a part of which communicates with the contact hole; and a conductive layer forming step of forming a conductive layer in the conductive layer forming groove and the contact hole.

In the imprint layer forming step, the imprint layer is formed on the surface of the foundation layer, and the contact hole is bored through a location in the imprint layer that overlaps at least a part of the foundation conductive layer of the foundation layer. In the groove forming step, once the conductive layer forming groove is formed by partially depressing the surface of the imprint layer, at least a part of the conductive layer forming groove is brought into communication with the contact hole. In the conductive layer forming step, the conductive layer is formed in the conductive layer forming groove and the contact hole in the imprint layer. The conductive layer formed in the conductive layer forming step is electrically continuously connected through the contact hole, which communicates with at least a part of the conductive layer forming groove, directly to the foundation conductive layer placed in the foundation layer. This makes it possible to eliminate the need for a member that is needed to connect a first conductive layer and a second conductive layer indirectly to each other in a conventional configuration in which it is difficult to electrically continuously connect the first conductive layer and the second conductive layer directly to each other. Further, in a case of forming the contact hole together with the conductive layer forming groove in the groove forming step, it is necessary to provide the imprint block, which is used in the groove forming step, with a pin for forming the contact hole, so that there is concern that the pin may be damaged. On the other hand, since the formation of the contact hole in the imprint layer in the imprint layer forming step eliminates the need to provide the imprint block, which is used in the groove forming step, with a pin for forming the contact hole, the imprint block is superior in durability or other properties.

The technology described herein makes it possible to electrically continuously connect a conductive layer directly to a foundation conductive layer.

DETAILED DESCRIPTION

First Embodiment

A first embodiment is described with reference to FIGS. 1 to 13. The first embodiment describes an organic EL display device (display device) 10 equipped with a touch panel function, a touch panel (substrate, circuit board, position input device) 20 of the organic EL display device 10, and a method for manufacturing the touch panel 20. It should be noted that some of the drawings show an X axis, a Y axis, and a Z axis and are drawn so that the direction of each axis is an identical direction in each drawing. FIG. 2, FIGS. 5 to 8B, and FIGS. 10 to 12B provide a basis for a vertical direction and show the front side up and the back side down.

Figure 1:
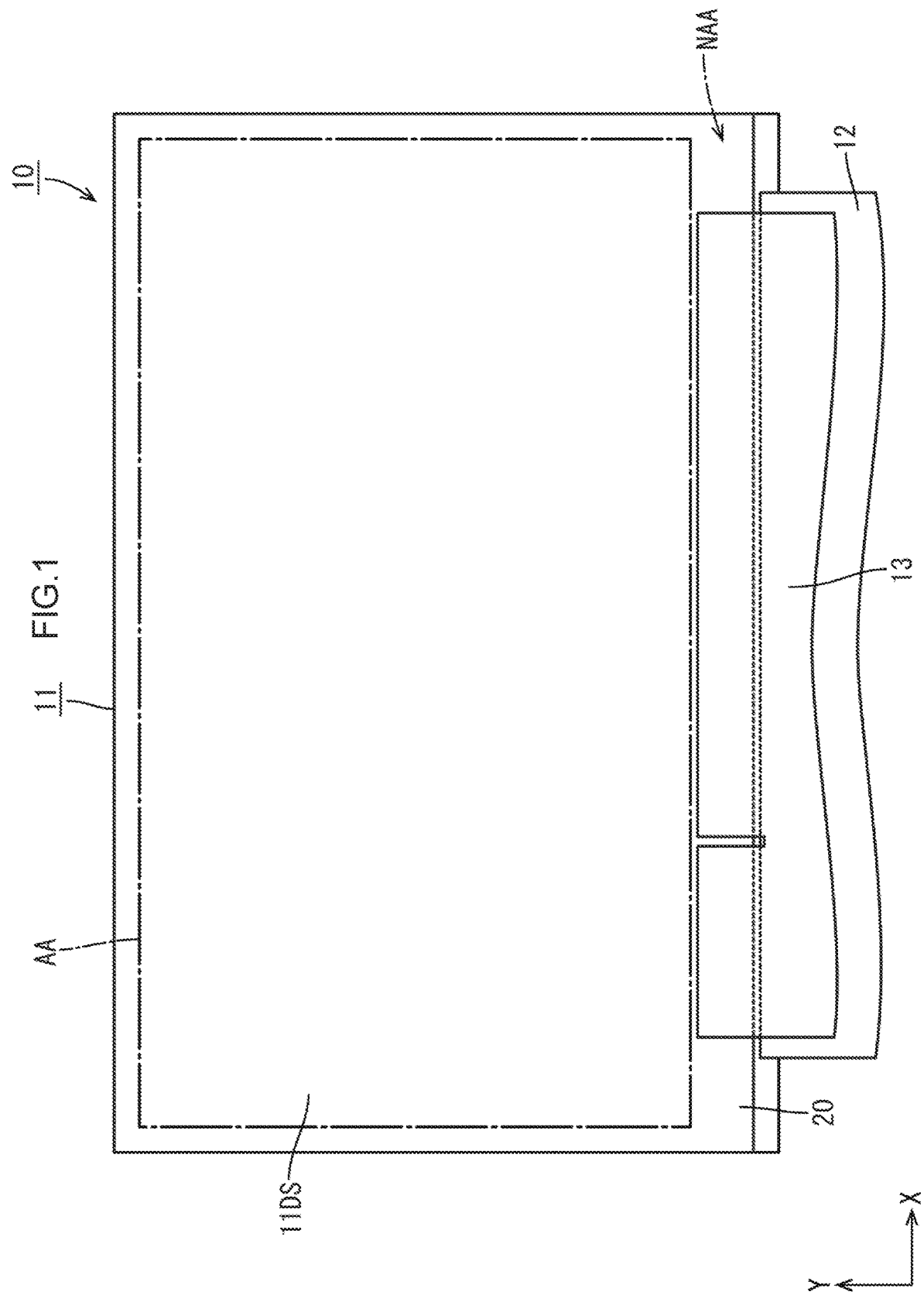
FIG. 1 is a plan view of an organic EL display device according to a first embodiment.
Figure 2:
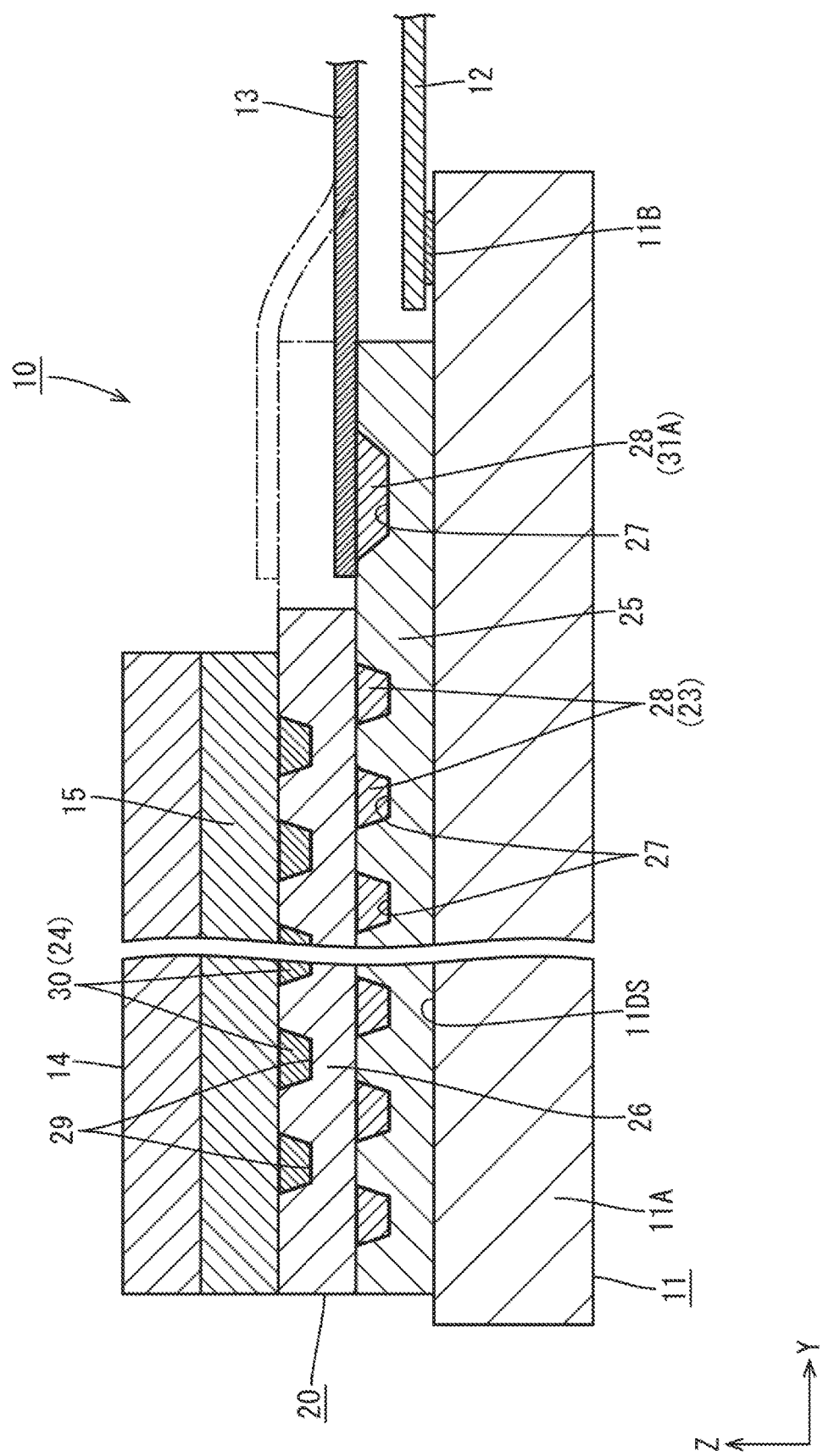
FIG. 2 is a schematic cross-sectional view of an end of an organic EL panel, and end of a touch panel, an end of a polarizing plate, and components around the ends.

First, a configuration of the organic EL display device 10 is described. As shown in FIGS. 1 and 2, the organic EL display device 10 has a horizontally long square shape as a whole, and has its long side direction corresponding to an X-axis direction, its short side direction corresponding to a Y-axis direction, and its plate thickness direction (direction normal to a plate surface) corresponding to a Z-axis direction. The organic EL display device 10 includes at least an organic EL panel (display panel, OLED display panel) 11 including, as a front side plate surface thereof, a display surface 11DS that is capable of displaying an image; a display flexible substrate (display panel connecting component) 12 that is connected to the organic EL panel 11; a touch panel 20, placed on the display surface 11DS of the organic EL panel 11, that detects a position (input position) that a user inputs; a touch panel flexible substrate (connecting component) 13 that is connected to the touch panel 20; and a polarizing plate 14 placed on a side of the touch panel 20 opposite to the organic EL panel 11. The organic EL panel 11, the polarizing plate 14, and the touch panel 20 each have a horizontally long square shape. Among these, the polarizing plate 14 includes a polarizing layer (polarizer) that selectively transmits linearly polarized light that oscillates in a particular direction, and is disposed so that the touch panel 20 is sandwiched between the polarizing plate 14 and the organic EL panel 11. Furthermore, the polarizing plate 14 includes a phase difference layer ($\lambda/4$ circularly polarizing plate) 15 on a plate surface thereof that faces the touch panel 20. The phase difference layer 15 is formed by applying a liquid crystal polymer material to the plate surface of the polarizing plate 14 that faces the touch panel 20, and imparts a phase difference of $\lambda/4$ to transmitted light. The phase difference layer 15 provides a reflected light suppressing function of selectively absorbing reflected light or other functions. Further, the polarizing plate 14 has a thickness of, for example, approximately 60 μm, including the phase difference layer 15.

As shown in FIG. 1, the display surface 11DS of the organic EL display panel 11 is divided into a display region (active area) AA where an image is displayed and a non-display region (non-active area) NAA, formed in the shape of a frame that surrounds the display region AA, where no image is displayed. It should be noted that FIG. 1 uses dot-and-dash lines to indicate the outer shape of the display region AA and the non-display region NAA is a region located on the outside of the dot-and-dash lines. As shown in FIG. 2, the organic EL panel 11 includes a base material 11A made of a flexible and substantially transparent synthetic resin (e.g. made of PET). The base material 11A has structures formed therein by using a known evaporation method or the like. Examples of the structures include an organic EL layer that emits light; a reflecting electrode that reflects light; a TFT (switching element), connected to the organic EL layer, that controls an electric current; a phosphor layer that forms the organic EL layer; a hygroscopic layer (moisture-proof layer) constituted by a multilayer film; and a sealant. The TFT includes a semiconductor film made of polycrystalline silicon or an oxide semiconductor. The base material 11A has a thickness of, for example, approximately 40 µm. Further, a dimension obtained by subtracting the thickness of the base material 11A from the thickness of the organic EL panel 11 is for example approximately 10 µm. Further, the front side surface of the organic EL panel 11 constitutes the display surface 11DS.

As shown in FIGS. 1 and 2, the display flexible substrate 12 and the touch panel flexible substrate 13 have flexibility by each including a film base material made of a synthetic resin material (such as polyimide resin), and each have a large number of wiring patterns on the base material. The display flexible substrate 12 has its first end connected to the base material 11A of the organic EL panel 11 and its second end connected to a control substrate serving as a signal supply source, so that signals responsible for image display or other signals that are supplied from the control substrate can be transmitted to the base material 11A. Meanwhile, the touch panel flexible substrate 13 has its first end connected to the touch panel 20 and its second end connected to the control substrate, so that signals responsible for position detection or other signals that are supplied from the control substrate can be transmitted to the touch panel 20. Provided at a first (lower side shown in FIG. 1) long-side end of the organic EL panel 11 is a panel terminal area 11B that is connected to an end of the display flexible substrate 12. Provided at a first long-side end of the touch panel 20 are terminals 31A and 32A that are connected to an end of the touch panel flexible substrate 13. The terminals 31A and 32A will be descried in detail later.

Figure 3:
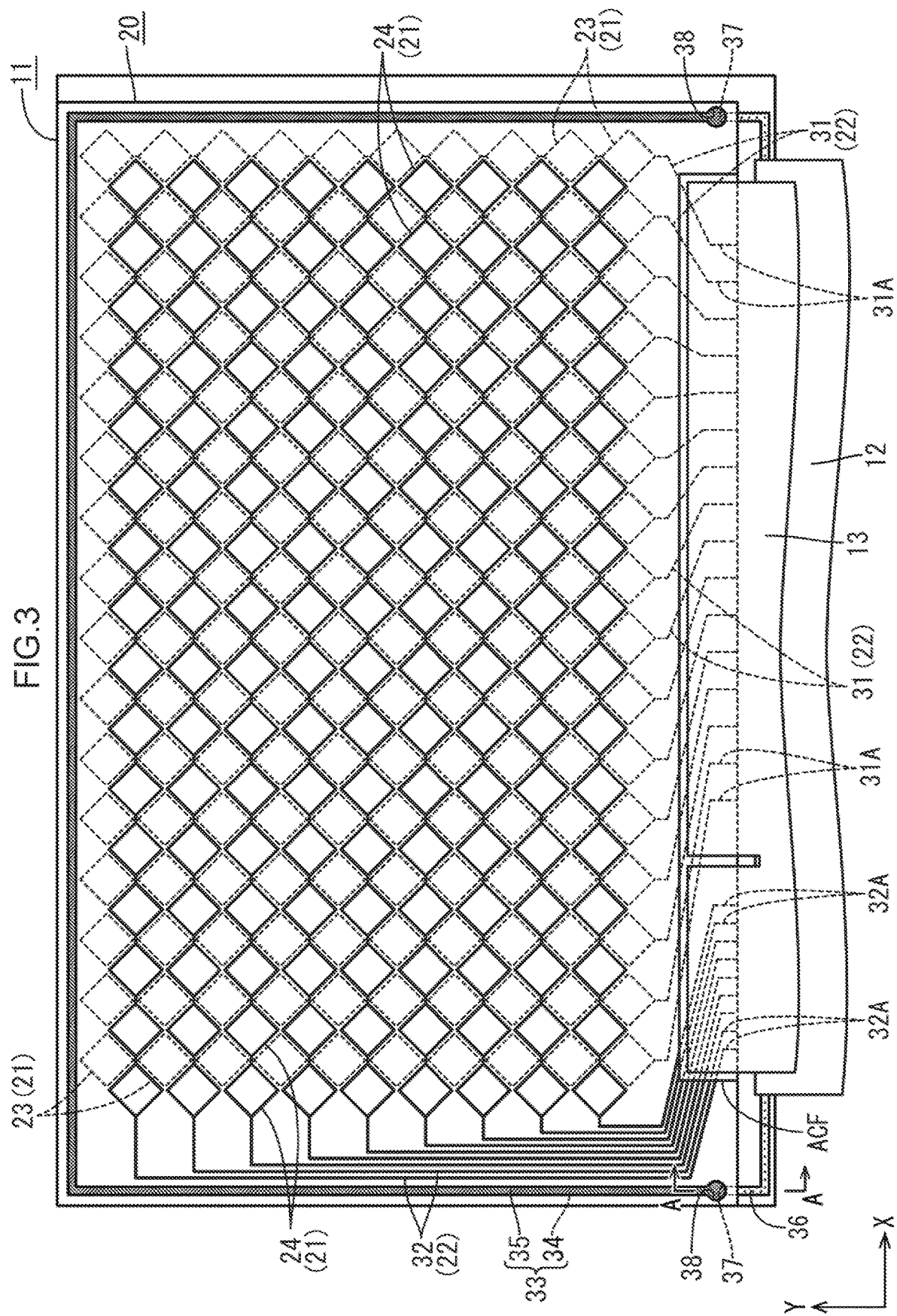
FIG. 3 is a plan view of the organic EL panel and the touch panel and a plan view schematically showing a touch panel pattern.

As already mentioned, the organic EL panel 11 according to the first embodiment have both a display function of displaying an image and a touch panel function (position input function) of detecting a position (input position) that the user inputs in accordance with an image displayed, and among these, the touch panel function is fulfilled by a touch panel pattern of the touch panel 20, which is integrated (in an on-cell form) with the organic EL panel 11. As shown in FIG. 2, the touch panel 20 is provided in such a manner as to overlap the front side of the organic EL panel 11. The touch panel 20 has a thickness of, for example, approximately 20 µm that is thinner than that of the base material 11A of the organic EL panel 11 and that of the polarizing plate 14. Further, a dimension obtained by adding together the dimension obtained by subtracting the thickness of the base material 11A from the thickness of the organic EL panel 11 and the thickness of the touch panel 20 is for example approximately 30 µm. Accordingly, the organic EL display device 10 has an extremely thin overall thickness of, for example, approximately 130 µm and is therefore superior in bendability and suitable for use especially in a foldable device. The touch panel pattern of so-called the touch panel 20 is of a projected capacitance type, and adopts a detecting scheme of a mutual capacitance type. As shown in FIG. 3, the touch panel pattern includes at least multiple touch electrodes (position detecting electrodes) 21 arranged in a matrix in a plane of the touch panel 20. The touch electrodes 21 are placed in a region in the touch panel 20 that overlaps the display region AA of the organic EL panel 11. Accordingly, the display region AA in the organic EL panel 11 substantially corresponds to a touch region that is capable of detecting an input position, and the non-display region NAA substantially corresponds to a non-touch region that is incapable of detecting an input position. Further, the non-touch region in the touch panel 20 is provided with peripheral wires 22 each having its first end connected to a touch electrode 21 and its second end connected to a terminal 31A or 32A connected to the touch panel flexible substrate 13.

Moreover, when the user moves a finger (position inputter, which is an electric conductor) closer to the touch panel 20 in an attempt to input a position in accordance with an image on the display region AA that the user views, capacitances are formed between the finger and touch electrodes 21. As a result, a capacitance that is detected by a touch electrode 21 located near the finger changes as the finger approaches, and is different from that which is detected by a touch electrode 21 situated away from the finger. This makes it possible to detect the input position in accordance with the difference.

In particular, the touch electrodes 21 include multiple first touch electrodes (first position detecting electrodes) 23 linearly arranged along a Y-axis direction (first direction) and multiple second touch electrodes (second position detecting electrodes) 24 linearly arranged along an X-axis direction (second direction) orthogonal to (intersecting) the Y-axis direction. The first touch electrodes 23 and the second touch electrodes 24 each have a substantially rhombic planar shape, and are arranged in such a manner as to planarly fill the touch region in a plate surface of the touch panel 20, i.e. in such a manner so not to overlap each other. Further, the first touch electrodes 23 and the second touch electrodes 24 are each sized to have a diagonal dimension of, for example, approximately 5 mm. First touch electrodes 23 adjacent to one another in the Y-axis direction have their mutually adjacent ends connected to one another, whereby multiple first touch electrodes 23 forming a line by being arranged along the Y-axis direction are electrically connected to one another to constitute a group of first touch electrodes 23 arranged in a line along the Y-axis direction, and this group of first touch electrodes 23 makes it possible to detect an input position in the Y-axis direction. In the touch region of the touch panel 20, more than one of these groups of first touch electrodes 23 are placed at intervals in the X-axis direction. Second touch electrodes 24 adjacent to one another in the X-axis direction have their mutually adjacent ends connected to one another, whereby multiple second touch electrodes 24 forming a line by being arranged along the X-axis direction are electrically connected to one another to constitute a group of second touch electrodes 24 arranged in a line along the X-axis direction, and this group of second touch electrodes 24 makes it possible to detect an input position in the X-axis direction. In the touch region TA in the touch panel 20, more than one of these groups of second touch electrodes 24 are placed at intervals in the Y-axis direction. All this makes it possible to identify an input position in the X-axis direction and the Y-axis direction.

Places of connection between first touch electrodes 23 in the group of first touch electrodes 23 and places of connection between second touch electrodes 24 in the group of second touch electrodes 24 are disposed to overlap (intersect) each other, but are insulated from each other (prevented from becoming short-circuited with each other) by being placed in different layers from each other. In particular, as shown in FIG. 2, the touch panel 20 includes a stack of a first imprint layer (foundation layer, foundation imprint layer) 25, provided with the first touch electrodes 23, that has insulation properties and a second imprint layer (imprint layer) 26, provided with the second touch electrodes 24, that has insulation properties, with the first imprint layer 25 placed relatively at the back, i.e. facing the organic EL panel 11, and the second imprint layer 26 placed relatively at the front, i.e. facing the polarizing plate 14. The first imprint layer 25 and the second imprint layer 26 are both made of an ultraviolet-curable resin material (curable material, photo-curable material) and each have a thickness of, for example, approximately 5 μm to 10 μm. The first imprint layer 25 and the second imprint layer 26 are stacked in a state of having been solidly spread over a large portion of the organic EL panel 11, on which the touch panel 20 is to be installed, excluding a part of the organic EL panel 11 (such as a place where the panel terminal area 11B is formed). That is, the first imprint layer 25 and the second imprint layer 26 are disposed not to overlap the panel terminal area 11B. The first imprint layer 25 is provided with a first conductive layer forming groove (foundation groove, foundation conductive layer forming groove) 27 formed by partially depressing a front side surface of the first imprint layer 25 (opposite to the organic EL panel 11) and a first conductive layer (foundation conductive layer) 28, placed within the first conductive layer forming groove 27, that constitutes a first touch electrode 23 or the like. Similarly, the second imprint layer 26 is provided with a second conductive layer forming groove (conductive layer forming groove, groove) 29 formed by partially depressing a front side surface of the second imprint layer 26 (opposite to the first imprint layer 25) and a second conductive layer (conductive layer) 30, placed within the second conductive layer forming groove 29, that constitutes a second touch electrode 24 or the like. The first conductive layer forming groove 27 and the second conductive layer forming groove 29 are formed in the surfaces of the first imprint layer 25 and the second imprint layer 26, respectively, by a so-called imprint method. The first conductive layer forming groove 27 and the second conductive layer forming groove 29 have groove depths that are slightly smaller than half the thicknesses of the first imprint layer 25 and the second imprint layer 26, respectively. Specifically, the first conductive layer forming groove 27 and the second conductive layer forming groove 29 have groove depths of, for example, approximately less than 5 μm. The first conductive layer 28 and the second conductive layer 30 are formed by drying and curing, as a main material, metal ink (such as silver nanoink) containing a metal material (such as silver) having superior electrical conductivity. Although it is preferable, for the purpose of securing surface smoothness, that the first conductive layer 28 and the second conductive layer 30, formed in the first conductive layer forming groove 27 and the second conductive layer forming groove 29, have their outer surfaces flush with the outermost surfaces of the first imprint layer 25 and the second imprint layer 26, respectively, this is not necessarily intended to impose any limitation.

Figure 4:
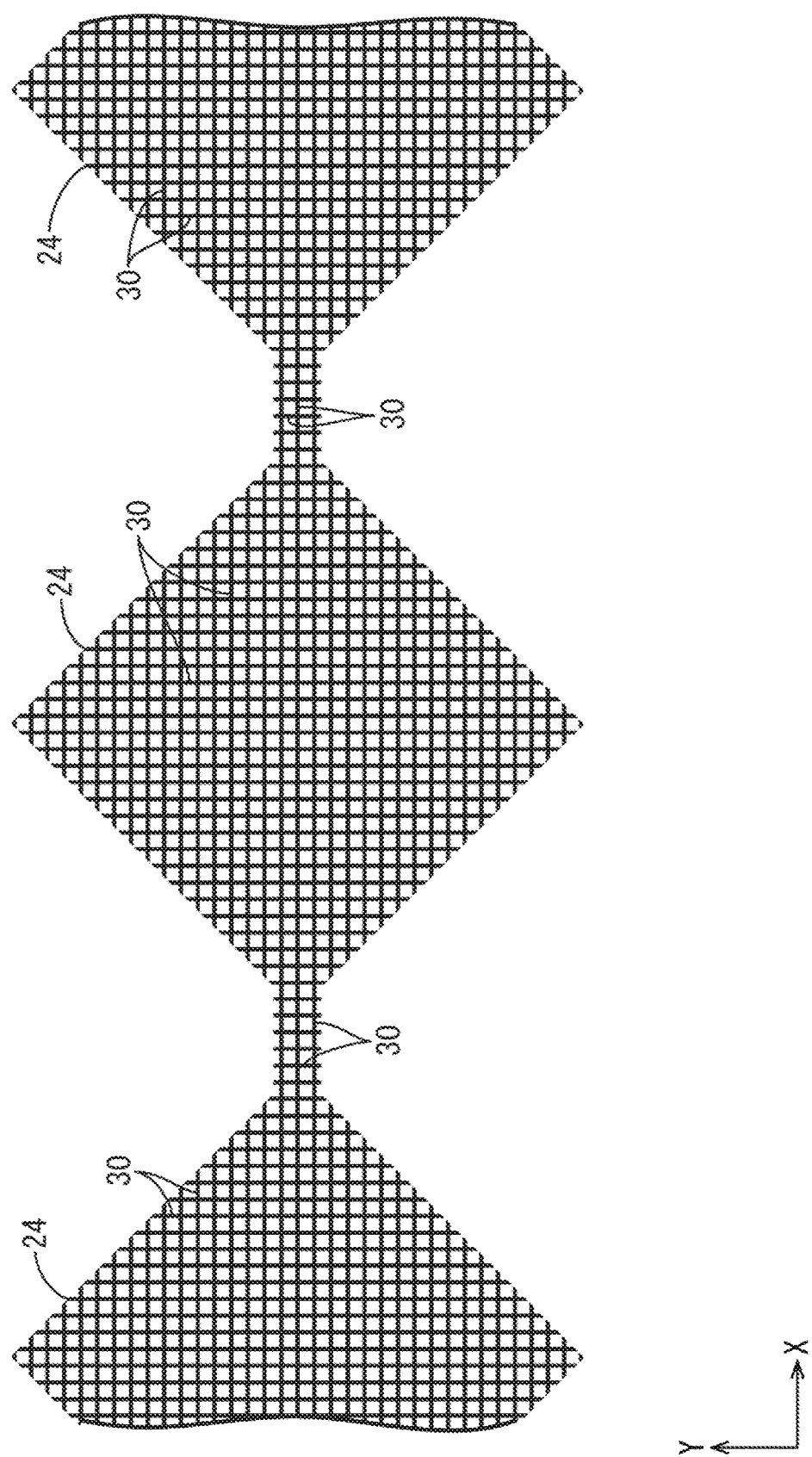
FIG. 4 is an enlarged plan view of second touch electrodes constituting the touch panel pattern.

As shown in FIG. 4, the first conductive layer 28 and the second conductive layer 30 have line widths of, for example, approximately 3 μm that are slightly smaller than the outer dimensions (approximately 5 mm) of the first touch electrodes 23 and the second touch electrodes 24, respectively, and include those which linearly extend along the X-axis direction and those which linearly extend along the Y-axis direction. It should be noted that although FIG. 4 representatively illustrates second touch electrodes 24 constituted by second conductive layers 30, first touch electrodes 23 constituted by first semiconductor layers 28 are identical in configuration. A large number of those first and second conductive layers 28 and 30 which linearly extend along the X-axis direction are arranged in parallel at intervals in the Y-axis direction, and a large number of those first and second conductive layers 28 and 30 which linearly extend along the Y-axis direction are arranged in parallel at intervals in the X-axis direction, whereby groups of first conductive layers 28 and groups of second conductive layers 30 are routed in a netlike pattern (mesh pattern) in the ranges of formation of the first touch electrodes 23 and the second touch electrodes 24, respectively. Further, first conductive layers 28 intersecting each other are electrically short-circuited with each other, and second conductive layers 30 intersecting each other are electrically short-circuited with each other. This makes it easy for light to pass through the first touch electrodes 23 and the second touch electrodes 24 in the touch region of the touch panel 20, thereby making it possible to attain a sufficient display luminance of an image in the display region AA of the organic EL panel 11. Thus, although the first conductive layers 28 and the second conductive layers 30 are minute, these minute first and second conductive layers 28 and 30 can be placed in appropriate locations in the plane of the touch panel 20, as the ranges of formation of the first conductive layers 28 and the second conductive layers 30 are defined in advance by the first conductive layer forming groove 27 and the second conductive layer forming groove 29, respectively. As is the case with the first conductive layers 28 and the second conductive layers 30, the first conductive layer forming groove 27 and the second conductive layer forming groove 29, within which a first conductive layer 28 and a second conductive layer 30 are placed, respectively, include a large number of those which extend linearly along the X-axis direction and a large number of those which extend linearly along the Y-axis direction, whereby groups of first conductive layer forming grooves 27 and groups of second conductive layer forming grooves 29 form a grid-like pattern. Further, first conductive layer forming grooves 27 intersecting each other communicate with each other, and second conductive layer forming grooves 29 intersecting each other communicate with each other.

As shown in FIG. 3, the peripheral wires 22 include first peripheral wires (foundation peripheral conductive layers, foundation peripheral wires) 31 placed in a non-touch region of the first imprint layer 25 and constituted by the first conductive layers 28 and second peripheral wires (peripheral conductive layer, peripheral wires) 32 placed in a non-touch region of the second imprint layer 26 and constituted by the second conductive layers 30. The first peripheral wires 31 are routed fanwise toward the region of mounting of the touch panel flexible substrate 13 from ends, located on a lower side shown in FIG. 3, of the groups of first touch electrodes 23 that extend along the Y-axis direction. The second peripheral wires 32 are routed toward the region of mounting of the touch panel flexible substrate 13 from ends, located on a left side shown in FIG. 3, of the groups of second touch electrodes 24 that extend along the X-axis direction. The first peripheral wires 31 and the second peripheral wires 32 each have a first terminal (foundation terminal) 31A and a second terminal (terminal) 32A, respectively, placed in the region of mounting of the touch panel flexible substrate 13, that are electrically connected via an anisotropic conductive film ACF to terminals on the side of the touch panel flexible substrate 13. More than one of these first terminals 31A are placed at intervals along the X-axis direction in a large portion, located on a right side shown in FIG. 3, of the region of mounting of the touch panel flexible substrate 13. More than one of these second terminals 32A are placed at intervals along the X-axis direction in a part, located on the left side shown in FIG. 3 (facing the side to which the second peripheral wires 32 are drawn from the groups of second touch electrodes 24), of the region of mounting of the touch panel flexible substrate 13. The second imprint layer 26 is disposed to overlap a large portion of the first imprint layer 25, but is selectively disposed not to overlap the first terminals 31A. The first peripheral wires 31 and the second peripheral wires 32 are placed in the non-touch region of the touch panel 20, i.e. the non-display region NAA of the organic EL panel 11. Accordingly, portions of the first and second conductive layers 28 and 30 (first and second conductive layer forming grooves 27 and 29) that constitute the first peripheral wires 31 and the second peripheral wires 32 do not necessarily need to be formed in a netlike pattern unlike portions of them that constitute the first touch electrodes 23 and the second touch electrodes 24 and, for example, may be formed to be identical in width to the first peripheral wires 31 and the second peripheral wires 32.

As shown in FIG. 2, the second touch electrodes 24 and the second peripheral wires 32, which are placed in the foremost surface of the touch panel 20, are mostly (excluding the second terminals 32A) covered by the polarizing plate 14 attached to the front side of the touch panel 20. Since the polarizing plate 14 prevents the second touch electrodes 24 and the second peripheral wires 32 from exposed outward, the second touch electrodes 24 and the second peripheral wires 32 are protected.

As shown in FIG. 3, the touch panel 20 includes a ground wire 33 in addition to the touch electrodes 21 and the peripheral wires 22, which constitute the touch panel pattern. The ground wire 33 is placed near an outer peripheral end of the non-touch region (non-display region NAA) of the touch panel 20, and is provided so as to extend along three sides of the touch panel 20 excluding a side of the touch panel 20 on which the touch panel flexible substrate 13 has been mounted. The ground wire 33 surrounds the touch electrodes 21, which are placed in the touch region (display region AA), and the peripheral wires 22, which are placed in the non-touch region, en bloc from three sides. That is, the touch panel pattern is surrounded by the ground wire 33 from an outer peripheral side. The ground wire 33 serves to transmit a ground signal that is supplied from the aftermentioned panel-side ground wire 36 and, for example, has a function of preventing the entrance of extrinsic electrical noise, a function of shielding an electric field that is generated between the first touch electrodes 23 and the second touch electrodes 24, or other functions. The ground wire 33 includes a first ground wire 34 constituted by a first conductive layer 28 and a second ground wire 35 constituted by a second conductive layer 30. The first ground wire 34 and the second ground layer 35 are disposed to form a substantially annular shape together and overlap each other in a plan view substantially all around them. The first ground wire 34 is provided within a first conductive layer forming groove 27 formed in the surface of the first imprint layer 25. The second ground wire 35 is provided within a second conductive layer forming grove 29 formed in the surface of the second imprint layer 26. It should be noted that as is the case with the first peripheral wires 31 and the second peripheral wires 32, the first ground wire 34 and the second ground wire 35 do not necessarily need to be formed in a netlike pattern unlike portions of them that constitute the first touch electrodes 23 and the second touch electrodes 24 and, for example, may be formed to be identical in width to each other.

Figure 5:
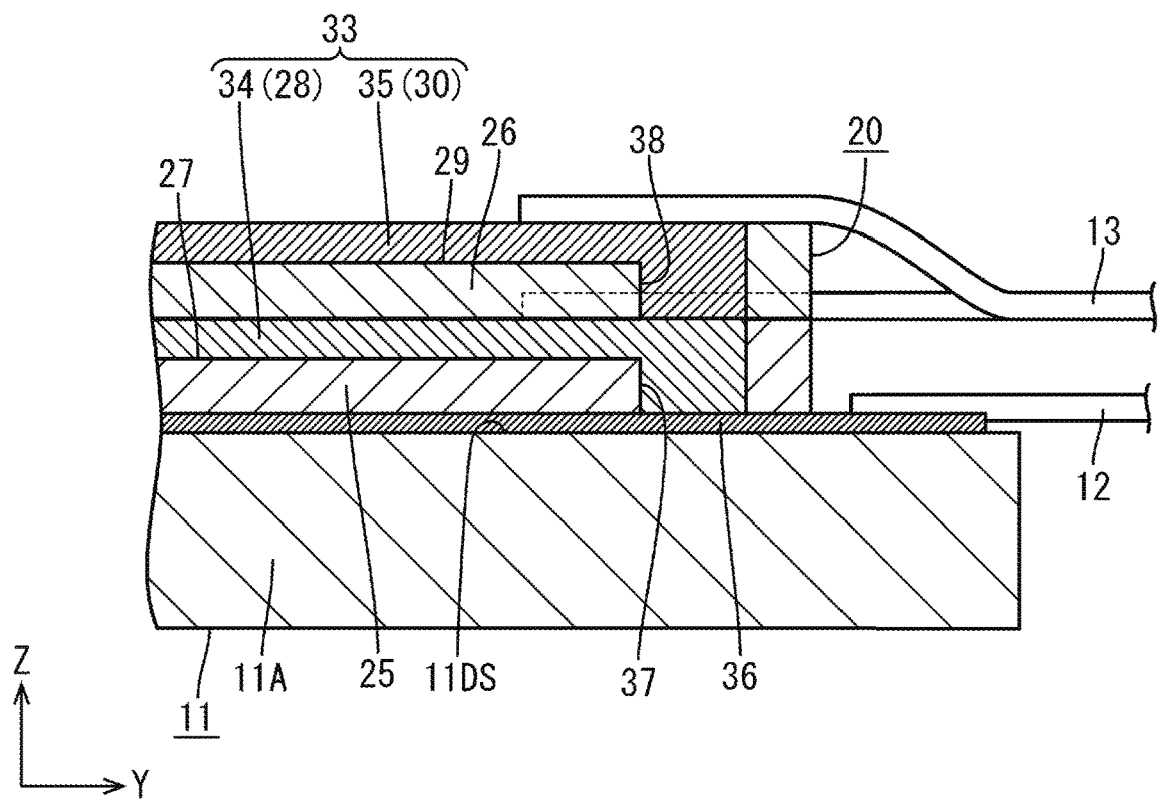
FIG. 5 is a cross-sectional view of the organic EL panel and the touch panel as taken along line A-A in FIG. 3.

On the other hand, as shown in FIG. 3, the organic EL panel 11 is provided with a panel-side ground wire 36 for supplying a ground signal to the aforementioned ground wire 33. It should be noted that FIG. 3 uses different levels of shading to illustrate the ground wire 33 and the panel-side ground wire 36. The panel-side ground wire 36 is constituted by a metal film formed on the base material 11A and can transmit, to the ground wire 33, a ground signal that is supplied from the control substrate via the display flexible substrate 12. The panel-side ground wire 36 is placed near an outer peripheral end of the non-display region NAA (non-touch region) of the organic EL panel 11, and forms a substantially frame shape (substantially annular shape) that extends along the outer shape of the organic EL panel 11. The panel-side ground wire 36 surrounds the display region AA (touch region). A large portion (three sides) of the panel-side ground wire 36 is disposed to overlap the ground wire 33 of the touch panel 20 in a plan view. Moreover, as shown in FIG. 5, the panel-side ground wire 36 is electrically continuously connected directly to the first ground wire 34 through a first contact hole (foundation contact hole) 37 bored through the first imprint layer 25 interposed between the panel-side ground wire 36 and the first ground wire 34. The first contact hole 37 communicates with a first conductive layer forming groove 27 in the first imprint layer 25 in which the first ground wire 34 has been formed. Furthermore, the first ground wire 34 is electrically continuously connected directly to the second ground wire 35 through a second contact hole (contact hole) 38 bored through the second imprint layer 26 interposed between the first ground wire 34 and the second ground wire 35. Accordingly, the second ground wire 35 is electrically continuously connected indirectly to the panel-side ground wire 36 via the first ground wire 34. As a result, a ground signal that is transmitted by the panel-side ground wire 36 is supplied to the first ground wire 34 and the second ground wire 35. The second contact hole 38 communicates with a second conductive layer forming groove 29 in the second imprint layer 26 in which the second ground wire 35 has been formed. The first contact hole 37 and the second contact hole 38 are disposed to overlap each other in substantially circular shapes in a plan view. Further, although it is preferable that the first contact hole 37 and the second contact hole 38 be about equal in radial dimension to each other, this is not necessarily intended to impose any limitation.

The organic EL display device 10 according to the first embodiment is structured as noted above, and the following describes methods for manufacturing an organic EL display device 10 and a touch panel 20. The method of producing a touch panel 20 includes a first imprint layer forming step (foundation imprint layer forming step) of forming a first imprint layer 25 on a display surface 11DS (surface) of an organic EL panel 11, a first groove forming step (foundation groove forming step, first imprint step) of forming a first conductive layer forming groove 27 by partially depressing a surface of the first imprint layer 25, a first conductive layer forming step (foundation conductive layer forming step) of forming a first conductive layer 28 in the first conductive layer forming groove 27, a second imprint layer forming step (imprint layer forming step) of forming a second imprint layer 26 on the front side surface of the first imprint layer 25 in which the first conductive layer forming groove 27 has been formed, a second groove forming step (groove forming step, second imprint step) of forming a second conductive layer forming groove 29 by partially depressing a surface of the second imprint layer 26, and a second conductive layer forming step (conductive layer forming step) of forming a second conductive layer 30 in the second conductive layer forming groove 29.

Figure 6:
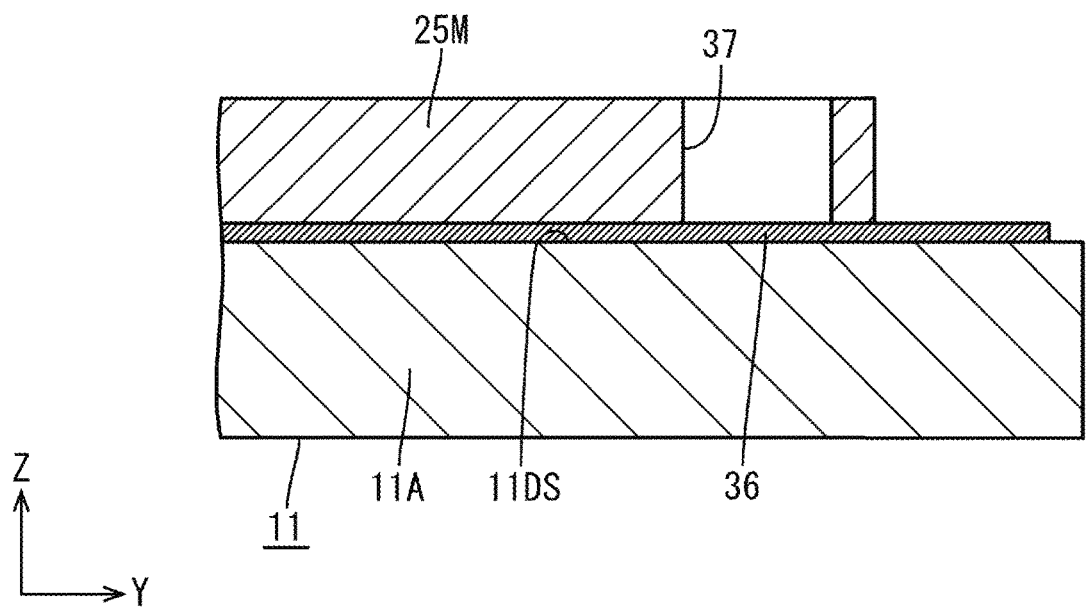
FIG. 6 is a cross-sectional view, taken along line A-A in FIG. 3, that shows a state where a first imprint layer has been formed on an organic EL panel in a first imprint layer forming step of a method for manufacturing a touch panel.

In the first imprint layer forming step, as shown in FIG. 6, a first imprint layer 25 made of an ultraviolet-curable resin material 25M is formed on the display surface 11DS of the organic EL panel 11. In this first imprint layer forming step, the ultraviolet-curable resin material (material of the first imprint layer 25) 25M is applied in an uncured state to the surface of the organic EL panel 11 by using an inkjet printer or a screen printer. An inkjet printing method involving the use of the inkjet printer or a screen printing method involving the use of the screen printer makes it possible to highly accurately control the range of application (range of formation), range of non-application (range of non-formation), and thickness of the ultraviolet-curable resin material 25M. Accordingly, a first contact hole 37 can be bored through a location in the first imprint layer 25 that overlaps a panel-side ground wire 36 placed on the surface of the organic EL panel 11. Since the position of formation and range of opening (radial dimension) of the first contact hole 37 are highly accurately defined, the first contact hole 37 is disposed to overlap the panel-side ground wire 36 with high certainty. At the stage of completion of the first imprint layer forming step, the radial dimension of the first contact hole 37 is set to be larger than a finished dimension, and has a larger range of opening than a place in the panel-side ground wire 36, which the first contact hole 37 overlaps, that is connected to a first ground wire 34.

Figure 7A:
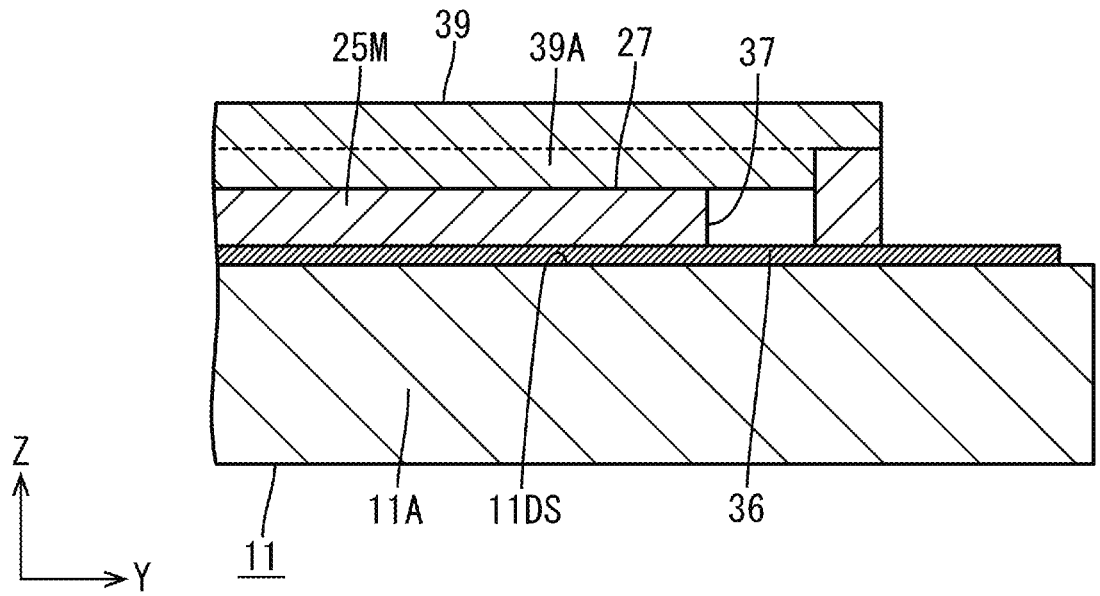
FIG. 7A is a cross-sectional view, taken along line A-A in FIG. 3, that shows a state where a first imprint block has been pressed onto an uncured first imprint layer in a first groove forming step of the method for manufacturing a touch panel.
Figure 7B:
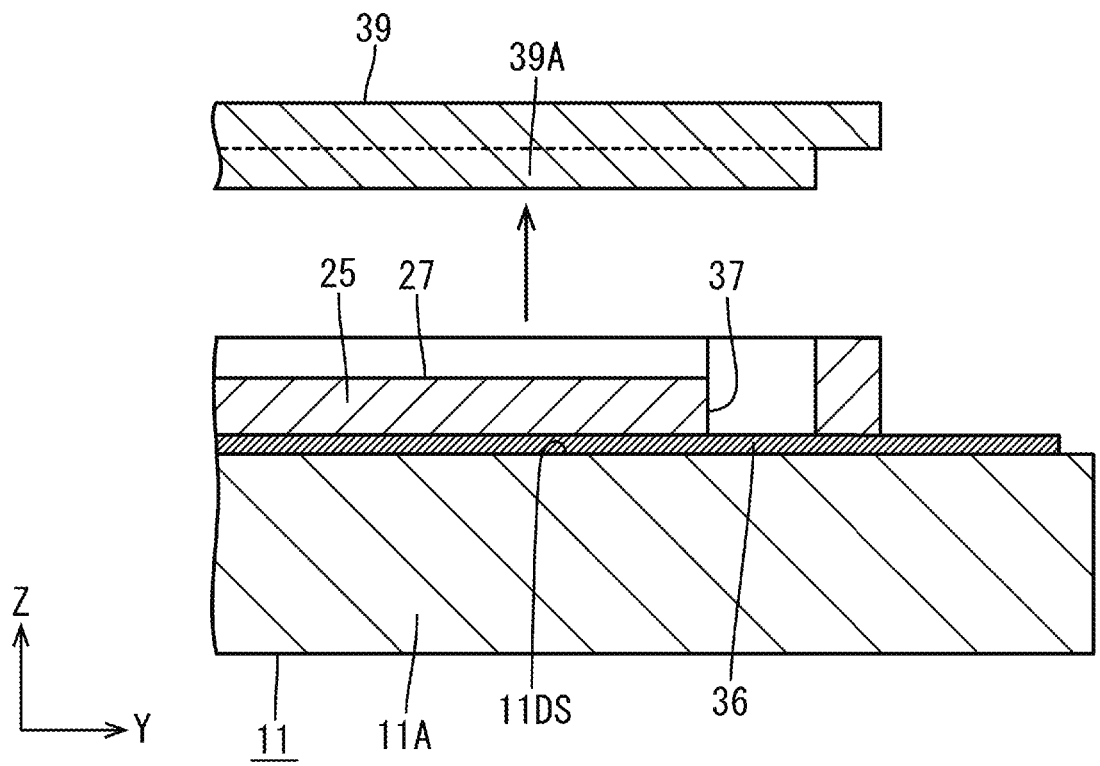
FIG. 7B is a cross-sectional view, taken along line A-A in FIG. 3, that shows a state where a first conductive layer forming groove has been formed with the first imprint layer cured in the first groove forming step of the method for manufacturing a touch panel.

Next, in the first groove forming step, as shown in FIG. 7A, a first imprint block (first pattern mask, first transfer block) 39 is pressed onto a surface of the ultraviolet-curable resin material 25M in an uncured state. The first imprint layer 25 is compressed and deformed into a thickness of approximately 5 μm to 10 μm by a force exerted by the first imprint block 39. At this point in time, the force exerted by the first imprint block 39 causes the ultraviolet-curable resin material 25M to be pressed in an uncured state to flow along the surface of the organic EL panel 11, and the flow is regulated by air that remains in the first contact hole 37, whereby the closure of the first contact hole 37 by the flow of the ultraviolet-curable resin material 25M is avoided. A certain level of flow of the ultraviolet-curable resin material 25M causes the first contact hole 37 to have a smaller radial dimension than it had at first. The first imprint block 39 has a fine first protrusion (protruding portion) 39A formed by transferring the shape of a first conductive layer forming groove 27 to a contact surface (molding surface) of the first imprint block 39 that comes into contact with the first imprint layer 25. Accordingly, the first imprint layer 25, onto which the first imprint block 39 has been pressed, comes to have a portion depressed by the first protrusion 39A being pressed into the portion. The first protrusion 39A includes a portion that transfers a portion of the first conductive layer forming groove 27 in which the first ground wire 34 is formed, and this portion is disposed to face the first contact hole 37. Irradiating the first imprint layer 25 with ultraviolet rays in this state causes the ultraviolet-curable resin material 25M, which has been in an uncured state, of the first imprint layer 25 to be completely cured. After that, as shown in FIG. 7B, removing the first imprint block 39 from the first imprint layer 25 causes the first conductive layer forming groove 27 to be formed by the portion of the first imprint layer 25 into which the first protrusion 39A of the first imprint block 39 was pressed. That is, the first conductive layer forming groove 27 is formed by the first imprint block 39 being transferred to the first imprint layer 25. At this point in time, a part of the first conductive layer forming groove 27 (portion in which the first ground wire 34 is formed) is brought into communication with the first contact hole 37. Further, the first contact hole 37 comes to have the finished dimension by having its radial dimension slightly reduced as the ultraviolet-curable resin material 25M cures.

Figure 8A:
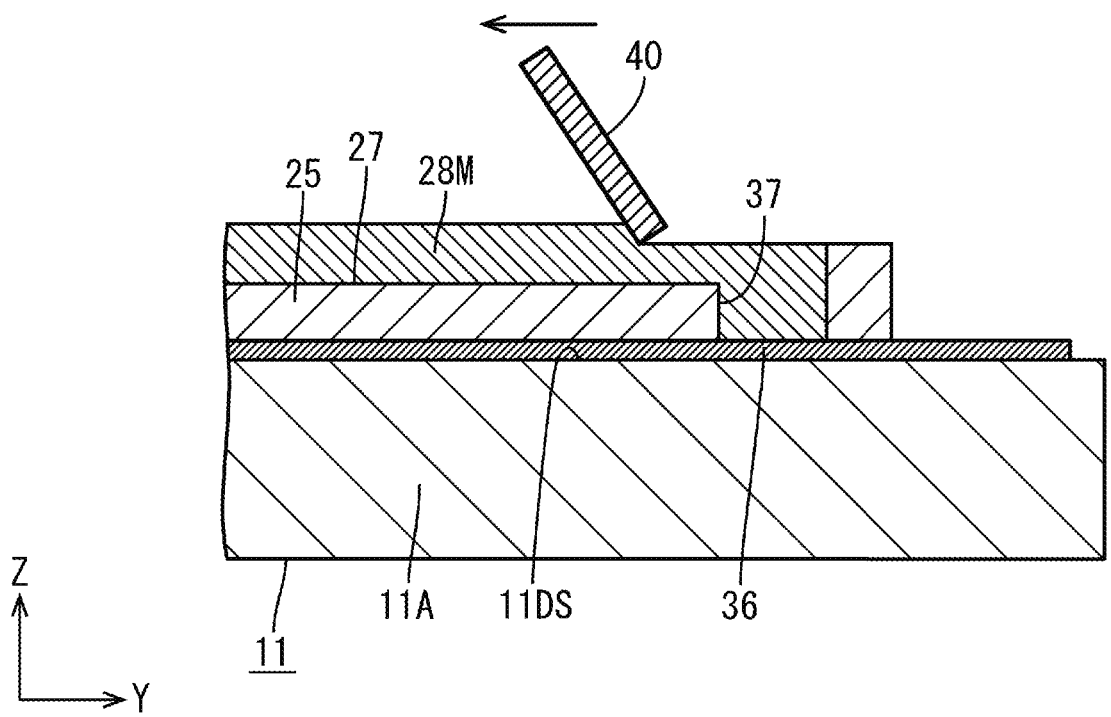
FIG. 8A is a cross-sectional view, taken along line A-A in FIG. 3, that shows a task of filling the first conductive layer forming groove with a material of a first conductive layer with a squeegee in a first conductive layer forming step of the method for manufacturing a touch panel.
Figure 8B:
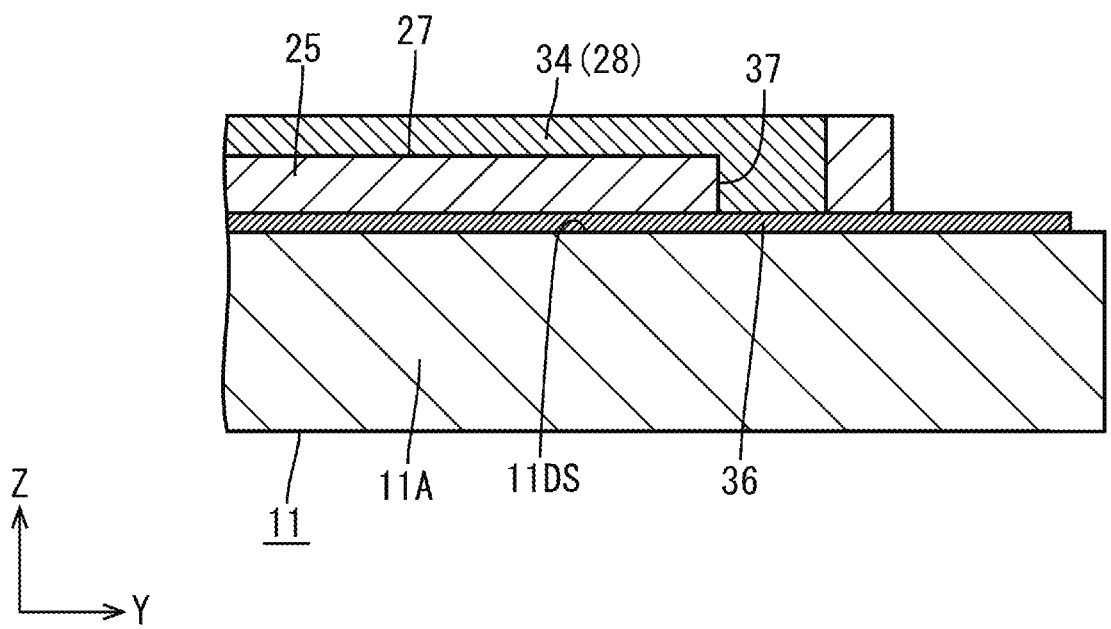
FIG. 8B is a cross-sectional view, taken along line A-A in FIG. 3, that shows a state where the first conductive layer has been formed in the first conductive layer forming step of the method for manufacturing a touch panel.

In the first conductive layer forming step, as shown in FIG. 8A, a material 28M of a first conductive layer 28 is applied to the surface of the first imprint layer 25 in which the first conductive layer forming groove 27 has been formed. The material 28M of the first conductive layer 28 has good fluidity and the like by being metal nanoink prepared by dispersedly solving nanoparticles of a metal material such as silver in a solvent composed of water, alcohol, and the like. The material 28M, which has been applied to the surface of the first imprint layer 25, of the first conductive layer 28 fills the first conductive layer forming groove 27 and the first contact hole 37 and is placed outside the first conductive layer forming groove 27. After that, as shown in FIG. 8B, when a squeegee 40 is slid along the surface of the first imprint layer 25, the material 28M of the first conductive layer 28 that is present on the surface of the first imprint layer 25 outside the first conductive layer forming groove 27 is removed by the squeegee 40, but the material 28M of the first conductive layer 28 that is present in the first conductive layer forming groove 27 and the first contact hole 37 remains without being removed by the squeegee 40. Further, even if some of a large number of these first conductive layer forming grooves 27 do not have their internal spaces filled with the material 28M of the first conductive layer 28, the internal spaces are filled with the material 28M of the first conductive layer 28 collected by the squeegee 40 from outside the first conductive layer forming grooves 27. As a result, all of the first conductive layer forming grooves 27 and the first contact hole 37 are filled with the material 28M of the first conductive layer 28. After that, the solvent contained in the material 28M of the first conductive layer 28 is evaporated by using a dryer, whereby the first conductive layer 28 is formed in the first conductive layer forming groove 27 and the first contact hole 37.

Figure 9:
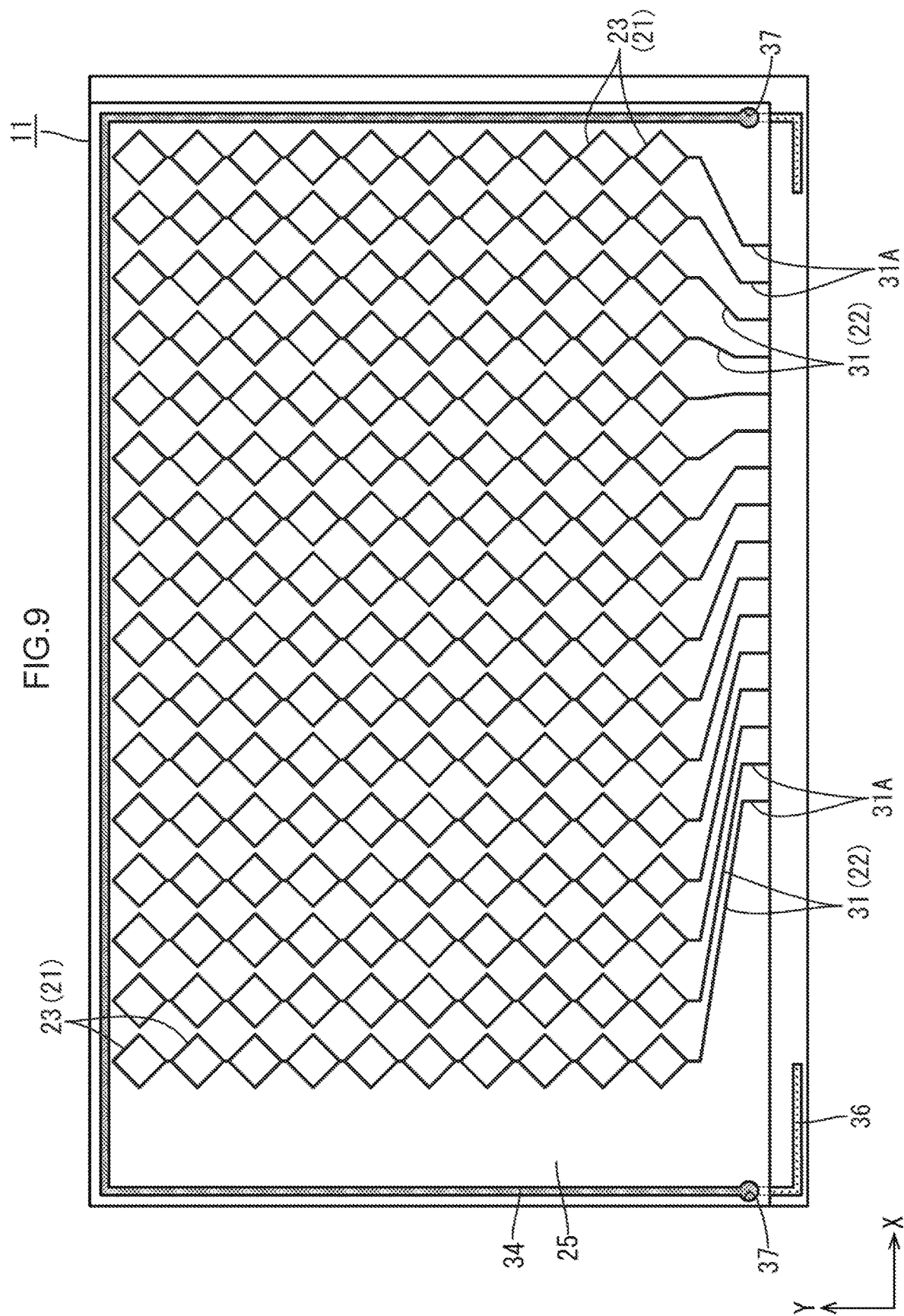
FIG. 9 is a plan view showing a state where the first conductive layer has been formed through the first conductive layer forming step of the method for manufacturing a touch panel.

In this way, as shown in FIG. 9, first touch electrodes 23, first peripheral wires 31 (including first terminals 31A), and the first ground wire 34, which are constituted by first conductive layers 28, are patterned in the surface of the first imprint layer 25. In this state, the first ground layer 34, which is constituted by a first conductive layer 28, is electrically continuously connected though the first contact hole 37 directly to the panel-side ground 36 placed on the surface of the organic EL panel 11 below the first ground wire 34. This makes it possible to eliminate the need for a member, such as a conductive paste material, that is needed to connect a first conductive layer and a second conductive layer indirectly to each other in a conventional configuration in which it is difficult to electrically continuously connect the first conductive layer and the second conductive layer directly to each other. Further, in a case of forming the first contact hole 37 together with the first conductive layer forming groove 27 in the first groove forming step, it is necessary to provide the first imprint block 39, which is used in the first groove forming step, with a pin for forming the first contact hole 37. Since this pin is locally greater in projection height than the first protrusion 39A, there is concern that the pin may be damaged. On the other hand, since the formation of the first contact hole 37 in the first imprint layer 25 in the first imprint layer forming step eliminates the need to provide the first imprint block 39, which is used in the first groove forming step, a pin for forming the first contact hole 37, the first imprint block 39 is superior in durability or other properties. It should be noted that a drying temperature in the dryer is for example approximately 80° C. and, in comparison with a photolithography step and a deposition step that are executed in the process of manufacturing the organic EL panel 11, a processing temperature is so low that harmful effects on structures (such as a phosphor layer, TFTs, pixel electrodes) provided inside the organic EL panel 11 are avoided.

Figure 10:
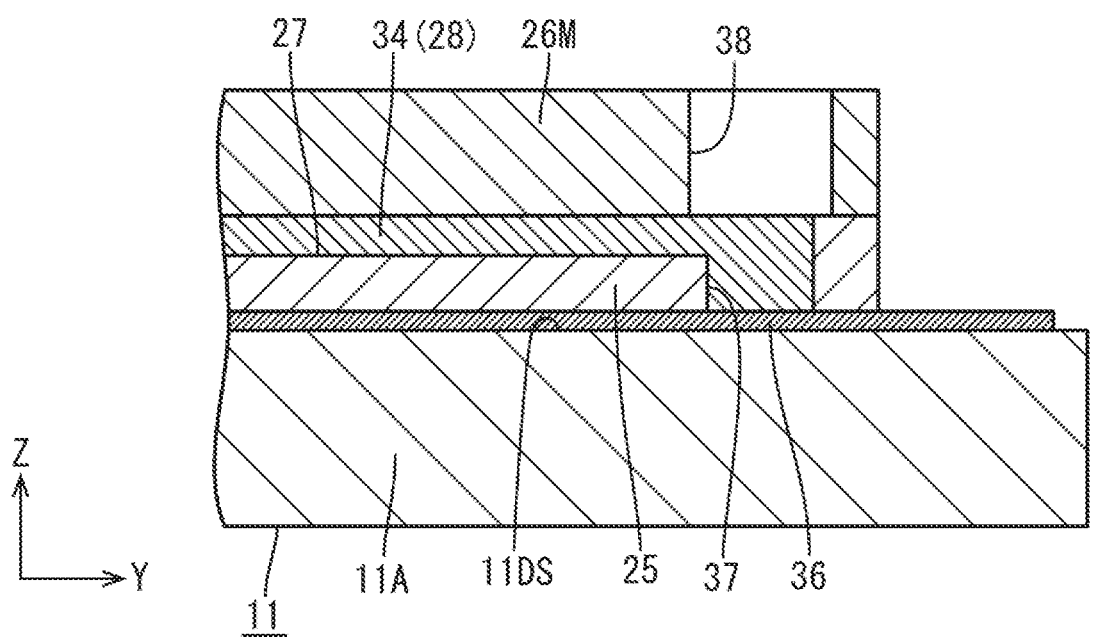
FIG. 10 is a cross-sectional view, taken along line A-A in FIG. 3, that shows a state where a second imprint layer has been formed over the organic EL panel in a second imprint layer forming step of the method for manufacturing a touch panel.

In the second imprint layer forming step, as shown in FIG. 10, a second imprint layer 26 made of an ultraviolet-curable resin material 26M is formed on the surface of the first imprint layer 25. In this second imprint layer forming step, the ultraviolet-curable resin material (material of the second imprint layer 26) 26M is applied in an uncured state to the surface of the first imprint layer 25 by using an inkjet printer or a screen printer. That is, the second imprint layer forming step involves the use of the same printing method as the first imprint layer forming step. An inkjet printing method involving the use of the inkjet printer or a screen printing method involving the use of the screen printer makes it possible to highly accurately control the range of application (range of formation), range of non-application (range of non-formation), and thickness of the ultraviolet-curable resin material 26M. Accordingly, a second contact hole 38 can be bored through a location in the second imprint layer 26 that overlaps the first ground wire 34 formed in the first imprint layer 25. Since the position of formation and range of opening (radial dimension) of the second contact hole 38 are highly accurately defined, the second contact hole 38 is disposed to overlap the first ground wire 34 with high certainty. At the stage of completion of the second imprint layer forming step, the radial dimension of the second contact hole 38 is set to be larger than a finished dimension, and has a larger range of opening than a place in the first ground wire 34, which the second contact hole 38 overlaps, that is connected to a second ground wire 35.

Figure 11A:
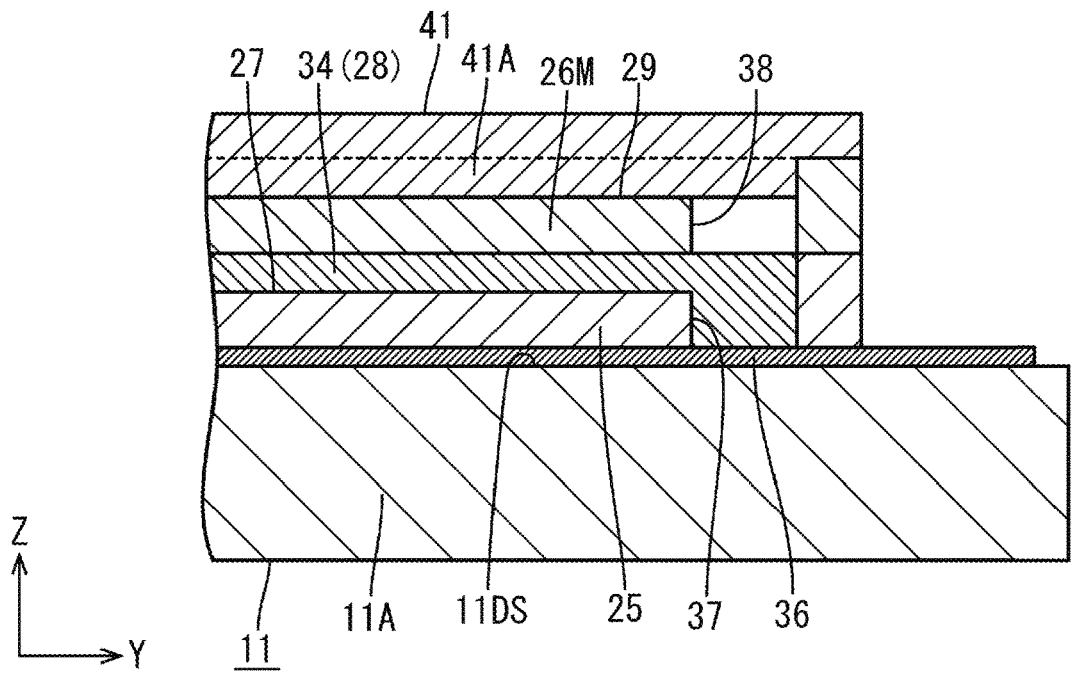
FIG. 11A is a cross-sectional view, taken along line A-A in FIG. 3, that shows a state where a second imprint block has been pressed onto an uncured second imprint layer in a second groove forming step of the method for manufacturing a touch panel.
Figure 11B:
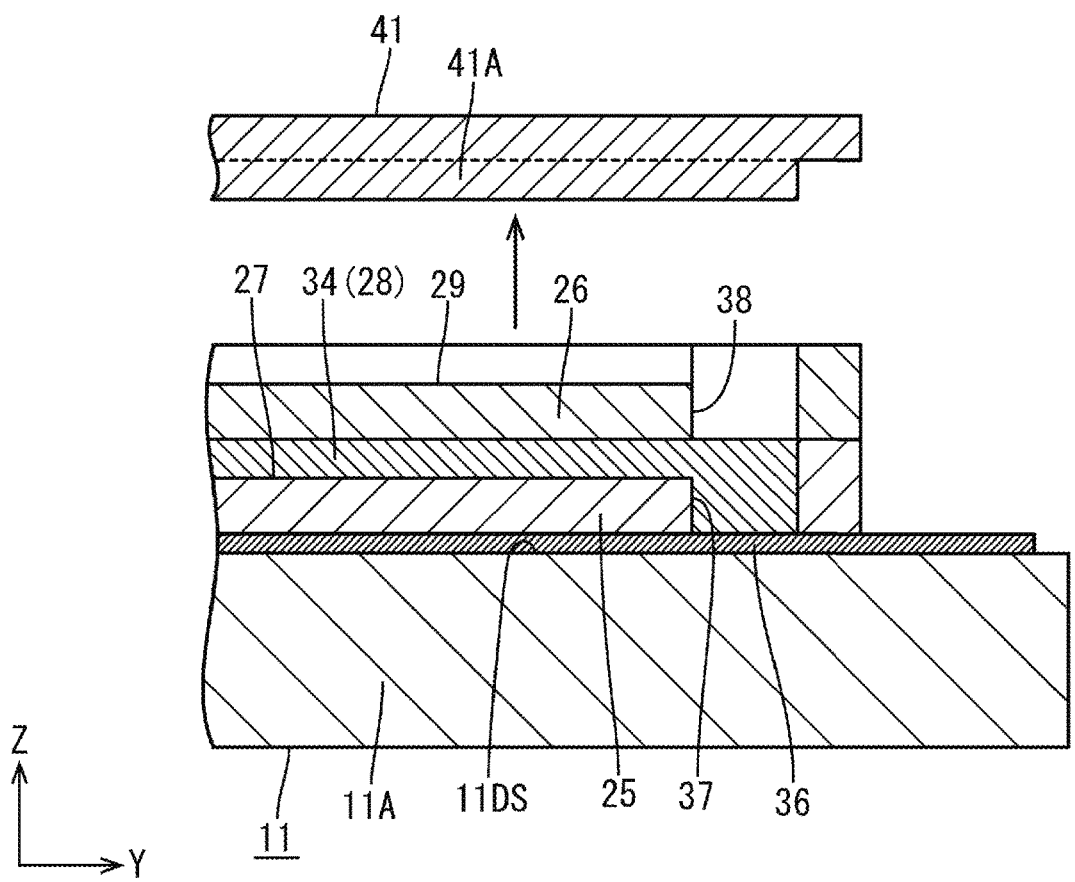
FIG. 11B is a cross-sectional view, taken along line A-A in FIG. 3, that shows a state where a second conductive layer forming groove has been formed with the second imprint layer cured in the second groove forming step of the method for manufacturing a touch panel.

Next, in the second groove forming step, as shown in FIG. 11A, a second imprint block (second pattern mask, second transfer block) 41 is pressed onto a surface of the ultraviolet-curable resin material 26M in an uncured state. The second imprint layer 26 is compressed and deformed into a thickness of approximately 5 μm to 10 μm by a force exerted by the second imprint block 41. At this point in time, the force exerted by the second imprint block 41 causes the ultraviolet-curable resin material 26M to be pressed in an uncured state to flow along the surface of the first imprint layer 25, and the flow is regulated by air that remains in the second contact hole 38, whereby the closure of the second contact hole 38 by the flow of the ultraviolet-curable resin material 26M is avoided. A certain level of flow of the ultraviolet-curable resin material 26M causes the second contact hole 38 to have a smaller radial dimension than it had at first. The second imprint block 41 has a fine second protrusion (protruding portion) 41A formed by transferring the shape of a second conductive layer forming groove 29 to a contact surface (molding surface) of the second imprint block 41 that comes into contact with the second imprint layer 26. Accordingly, the second imprint layer 26, onto which the second imprint block 41 has been pressed, comes to have a portion depressed by the second protrusion 41A being pressed into the portion. The second protrusion 41A includes a portion that transfers a portion of the second conductive layer forming groove 29 in which the second ground wire 35 is formed, and this portion is disposed to face the second contact hole 38. Irradiating the second imprint layer 26 with ultraviolet rays in this state causes the ultraviolet-curable resin material 26M, which has been in an uncured state, of the second imprint layer 26 to be completely cured. After that, as shown in FIG. 11B, removing the second imprint block 41 from the second imprint layer 26 causes the second conductive layer forming groove 29 to be formed by the portion of the second imprint layer 26 into which the second protrusion 41A of the second imprint block 41 was pressed. That is, the second conductive layer forming groove 29 is formed by the second imprint block 41 being transferred to the second imprint layer 26. At this point in time, a part of the second conductive layer forming groove 29 (portion in which the second ground wire 35 is formed) is brought into communication with the second contact hole 38. Further, the second contact hole 38 comes to have the finished dimension by having its radial dimension slightly reduced as the ultraviolet-curable resin material 26M cures.

Figure 12A:
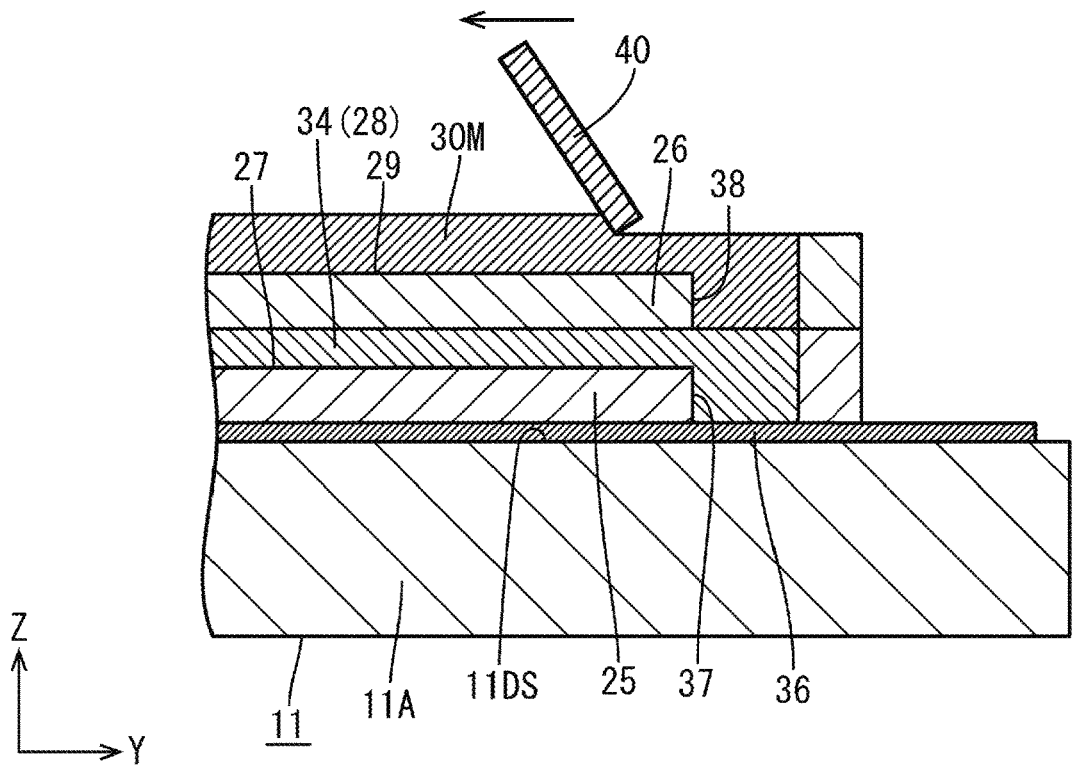
FIG. 12A is a cross-sectional view, taken along line A-A in FIG. 3, that shows a task of filling the second conductive layer forming groove with a material of a second conductive layer with the squeegee in a second conductive layer forming step of the method for manufacturing a touch panel.
Figure 12B:
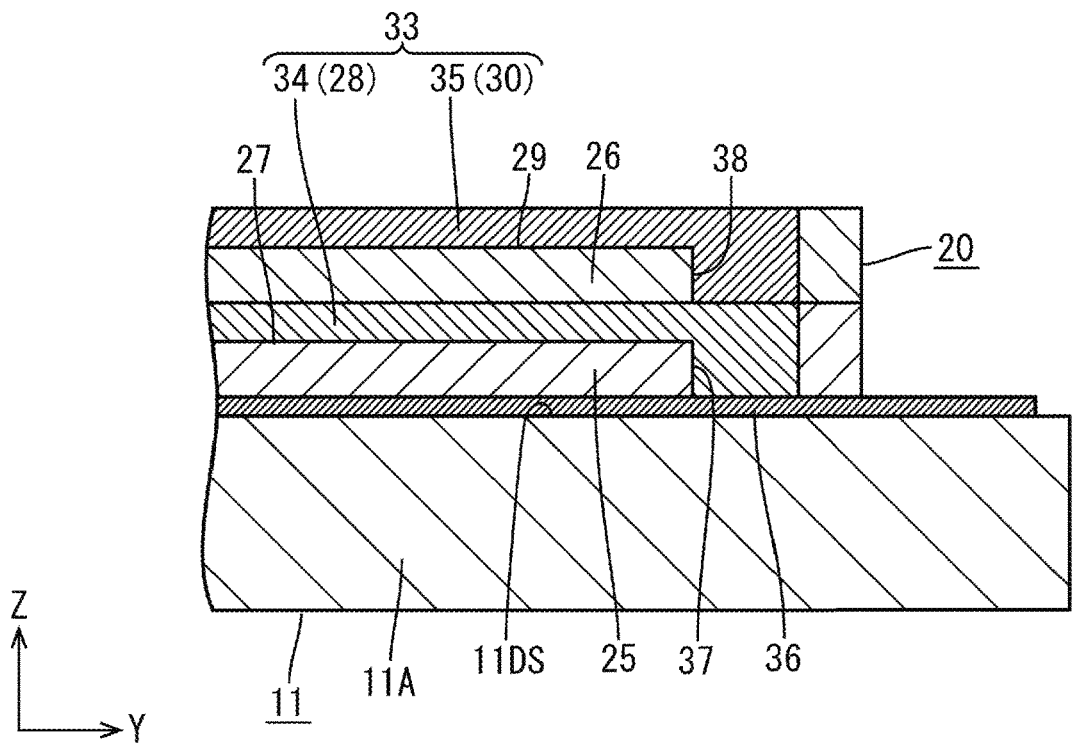
FIG. 12B is a cross-sectional view, taken along line A-A in FIG. 3, that shows a state where the second conductive layer has been formed through the second conductive layer forming step of the method for manufacturing a touch panel.

In the second conductive layer forming step, as shown in FIG. 12A, a material 30M of a second conductive layer 30 is applied to the surface of the second imprint layer 26 in which the second conductive layer forming groove 29 has been formed. The material 30M of the second conductive layer 30 has good fluidity and the like by being metal nanoink prepared by dispersedly solving nanoparticles of a metal material such as silver in a solvent composed of water, alcohol, and the like. The material 30M, which has been applied to the surface of the second imprint layer 26, of the second conductive layer 30 fills the second conductive layer forming groove 29 and the second contact hole 38 and is placed outside the second conductive layer forming groove 29. After that, as shown in FIG. 12B, when the squeegee 40 is slid along the surface of the second imprint layer 26, the material 30M of the second conductive layer 30 that is present on the surface of the second imprint layer 26 outside the second conductive layer forming groove 29 is removed by the squeegee 40, but the material 30M of the second conductive layer 30 that is present in the second conductive layer forming groove 29 and the second contact hole 38 remains without being removed by the squeegee 40. Further, even if some of a large number of these second conductive layer forming grooves 29 do not have their internal spaces filled with the material 30M of the second conductive layer 30, the internal spaces are filled with the material 30M of the second conductive layer 30 collected by the squeegee 40 from outside the second conductive layer forming grooves 29. As a result, all of the second conductive layer forming grooves 29 and the second contact hole 38 are filled with the material 30M of the second conductive layer 30. After that, the solvent contained in the material 30M of the second conductive layer 30 is evaporated by using a dryer, whereby the second conductive layer 30 is formed in the second conductive layer forming groove 29 and the second contact hole 38.

Figure 13:
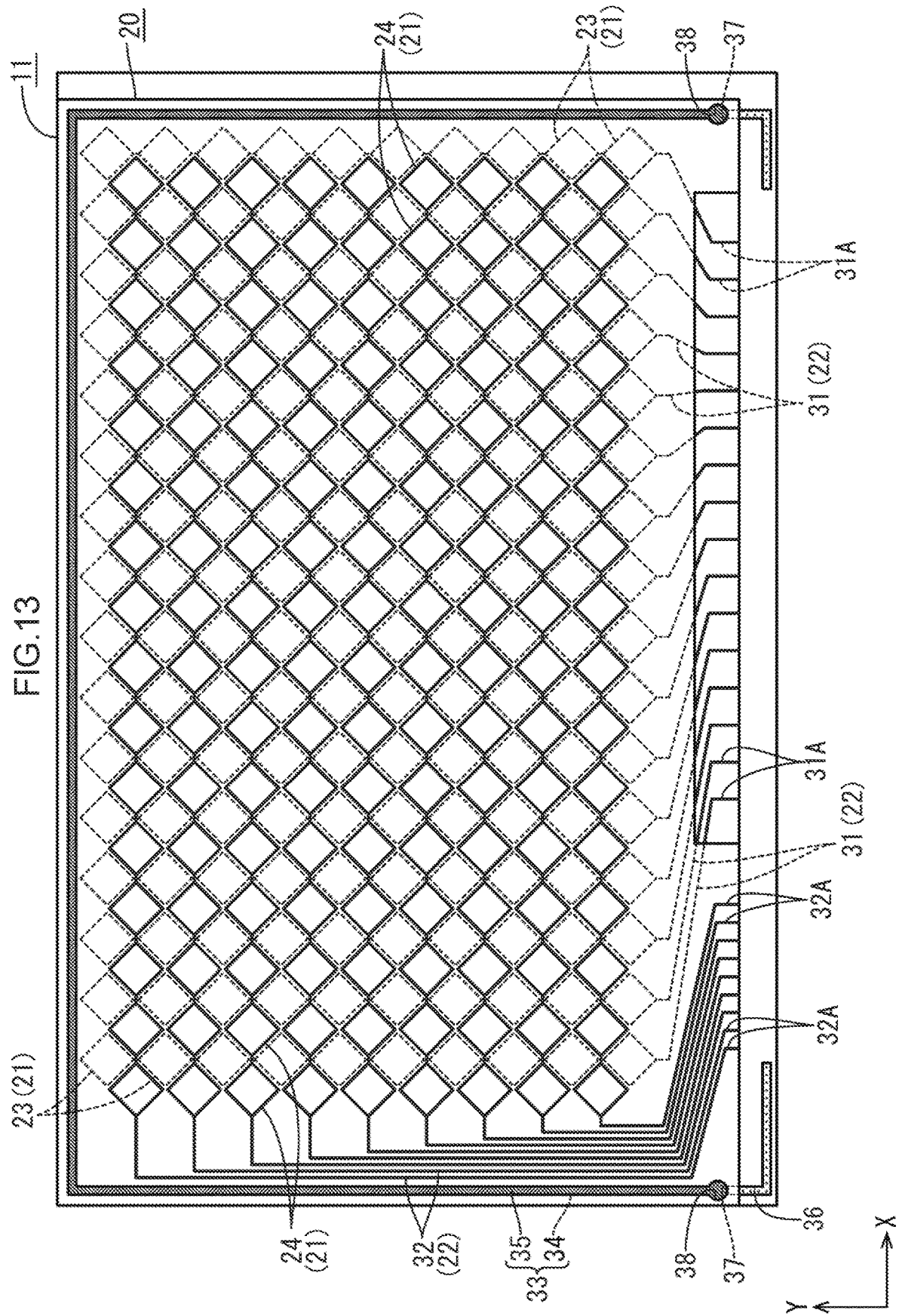
FIG. 13 is a plan view showing a state where the second conductive layer has been formed through the second conductive layer forming step of the method for manufacturing a touch panel.

In this way, as shown in FIG. 13, second touch electrodes 24, second peripheral wires 32 (including second terminals 32A), and the second ground wire 35, which are constituted by second conductive layers 30, are patterned in the surface of the second imprint layer 26. In this state, the second ground layer 35, which is constituted by a second conductive layer 30, is electrically continuously connected though the second contact hole 38 directly to the first ground wire 34 placed in the surface of the first imprint layer 25 below the second ground wire 35. This makes it possible to eliminate the need for a member, such as a conductive paste material, that is needed to connect a first conductive layer and a second conductive layer indirectly to each other in a conventional configuration in which it is difficult to electrically continuously connect the first conductive layer and the second conductive layer directly to each other. Further, in a case of forming the second contact hole 38 together with the second conductive layer forming groove 29 in the second groove forming step, it is necessary to provide the second imprint block 41, which is used in the second groove forming step, with a pin for forming the second contact hole 38. Since this pin is locally greater in projection height than the second protrusion 41A, there is concern that the pin may be damaged. On the other hand, since the formation of the second contact hole 38 in the second imprint layer 26 in the second imprint layer forming step eliminates the need to provide the second imprint block 41, which is used in the second groove forming step, a pin for forming the second contact hole 38, the second imprint block 41 has superior durability or other properties. It should be noted that a drying temperature in the dryer is for example approximately 80° C. and, in comparison with a photolithography step and a deposition step that are executed in the process of manufacturing the organic EL panel 11, a processing temperature is so low that harmful effects on structures (such as a phosphor layer, TFTs, pixel electrodes) provided inside the organic EL panel 11 are avoided.

As described above, a method for manufacturing a touch panel (substrate) 20 according to the first embodiment includes: an second imprint layer forming step (imprint layer forming step) of forming a second imprint layer (imprint layer) 26 on a surface of a first imprint layer 25, which is a foundation layer, and boring a second contact hole 38 through a location in the second imprint layer 26 that overlaps at least a part of a first conductive layer (foundation conductive layer) 28 of the first imprint layer 25, which is the foundation layer; a second groove forming step (groove forming step) of, by partially depressing a surface of the second imprint layer 26, forming a second conductive layer forming groove (conductive layer forming groove) 29 at least a part of which communicates with the second contact hole 38; and a second conductive layer forming step (conductive layer forming step) of forming a second conductive layer (conductive layer) 30 in the second conductive layer forming groove 29 and the second contact hole 38.

In the second imprint layer forming step, the second imprint layer 26 is formed on the surface of the first imprint layer 25, which is the foundation layer, and the second contact hole 38 is bored through a location in the second imprint layer 26 that overlaps at least a part of the first conductive layer 28 of the first imprint layer 25. In the second groove forming step, once the second conductive layer forming groove 29 is formed by partially depressing the surface of the second imprint layer 26, at least a part of the second conductive layer forming groove 29 is brought into communication with the second contact hole 38. In the second conductive layer forming step, the second conductive layer 30 is formed in the second conductive layer forming groove 29 and the second contact hole 38 in the second imprint layer 26. The second conductive layer 30 formed in the second conductive layer forming step is electrically continuously connected through the second contact hole 38, which communicates with at least apart of the second conductive layer forming groove 29, directly to the first conductive layer 28 placed in the first imprint layer 25, which is the foundation layer. This makes it possible to eliminate the need for a member that is needed to connect a first conductive layer and a second conductive layer indirectly to each other in a conventional configuration in which it is difficult to electrically continuously connect the first conductive layer and the second conductive layer directly to each other. Further, in a case of forming the second contact hole 38 together with the second conductive layer forming groove 29 in the second groove forming step, it is necessary to provide the second imprint block 41, which is used in the second groove forming step, with a pin for forming the second contact hole 38, so that there is concern that the pin may be damaged. On the other hand, since the formation of the second contact hole 38 in the second imprint layer 26 in the second imprint layer forming step eliminates the need to provide the second imprint block 41, which is used in the second groove forming step, with a pin for forming the second contact hole 38, the second imprint block 41 is superior in durability or other properties.

Further, in the second imprint layer forming step, the second imprint layer 26 is formed by an inkjet printing method or a screen printing method. In this way, the second imprint layer 26, which has been formed by the inkjet printing method or the screen printing method in the second imprint layer forming step, is highly accurate in thickness and range of formation. Accordingly, the second contact hole 38, which is bored through the second imprint layer 26, too is highly accurate in position of formation and range of opening, so that the second conductive layer 30 and the first conductive layer 28 are connected to each other with higher reliability.

Further, in the second imprint layer forming step, the second contact hole 38 is bored so as to have a larger range of opening than a place in the first conductive layer 28 that is connected to the second conductive layer 30. In this way, even if the range of opening of the second contact hole 38 becomes reduced in forming the second conductive layer forming groove 29 in the second imprint layer 26 in the second groove forming step, the reliability of a connection between the second conductive layer 30 and the first conductive layer 28, which are connected to each other through the second contact hole 38, is sufficiently secured, as the second imprint layer forming step, which precedes the second groove forming step, has caused the second contact hole 38 to have a larger range of opening than the place in the first conductive layer 28 that is connected to the second conductive layer 30.

Further, the second imprint layer forming step is preceded by a first imprint layer forming step (foundation imprint layer forming step) of forming a first imprint layer (foundation imprint layer) 25 as the foundation layer, a first groove forming step (foundation groove forming step) of forming a first conductive layer forming groove (foundation groove) 27 by partially depressing a surface of the first imprint layer 25 that faces the second imprint layer 26, and a first conductive layer forming step (foundation conductive layer forming step) of forming the first conductive layer 28 in the first conductive layer forming groove 27. In this way, the first imprint layer 25, which is the foundation layer, is formed in the first imprint layer forming step. In the first groove forming step, the first conductive layer forming groove 27 is formed by partially depressing the surface of the first imprint layer 25. In the first conductive layer forming step, the first conductive layer 28 is formed in the first conductive layer forming groove 27 in the first imprint layer 25. After that, once the touch panel 20 is manufactured through the second imprint layer forming step, the second groove forming step, and the second conductive layer forming step, the second conductive layer 30 is electrically continuously connected directly to the first conductive layer 28 through the second contact hole 38 bored through the second imprint layer 26. Thus, the first conductive layer 28 placed in the first imprint layer 25 can be formed in the appropriate position by using an imprint technique.

Further, in the first imprint layer forming step, the first imprint layer 25 is formed by using a printing method which is identical to that used in the second imprint layer forming step. In this way, a reduction in manufacturing cost and the like is suitably achieved, as commonality of materials and manufacturing facilities can be better achieved than if the first imprint layer forming step and the second imprint layer forming step involve the use of different printing methods.

Further, in the first conductive layer forming step, a first ground wire 34 constituted by the first conductive layer 28 is formed, and in the second conductive layer forming step, a second ground wire 35 constituted by the second conductive layer 30 is formed. In this way, when the second ground wire 35, which is the second conductive layer 30, is formed in the second conductive layer forming step after the first ground wire 34, which is the first conductive layer 28, has been formed in the first conductive layer forming step, the second ground wire 35 is electrically continuously connected directly to the first ground wire 34 through the second contact hole 38 bored through the second imprint layer 26. Since the first ground wire 34 and the second ground wire 35 are wider in line width than a wire that transmits a signal or other wires, the second contact hole 38, through which the first ground wire 34 and the second ground wire 35 are electrically continuously connected to each other, is sufficiently wide in range of opening in the second imprint layer 26. Accordingly, even if the range of opening of the second contact hole 38 becomes reduced in forming the second conductive layer forming groove 29 in the second imprint layer 26 in the second groove forming step, the reliability of a connection between the first ground wire 34 and the second ground wire 35, which are connected to each other through the second contact hole 38, is sufficiently secured.

Further, in the second conductive layer forming step and the first conductive layer forming step, a first touch electrode (first position detecting electrode) 23 and a second touch electrode (second position detecting electrode) 24 are formed as at least parts of the first conductive layer 28 and the second conductive layer 30, respectively, and the first touch electrode 23 and the second touch electrode 24 form capacitances with a position inputter that inputs a position, are capable of detecting a position inputted by the position inputter, and do not overlap each other. In this way, a position inputted by the position inputter can be detected by the first touch electrode 23 and the second touch electrode 24, constituted by the first conductive layer 28 and the second conductive layer 30, which do not overlap each other.

Further, a method for manufacturing an organic EL display device (display device) 10 according to the first embodiment includes: a first imprint layer forming step of forming a first imprint layer 25 as the foundation layer on a surface of the organic EL panel (display panel) 11; a first groove forming step of forming a first conductive layer forming groove 27 by partially depressing a surface of the first imprint layer 25 that faces the second imprint layer 26; and a first conductive layer forming step of forming the first conductive layer 28 in the first conductive layer forming groove 27, the second imprint layer forming step being preceded by the first imprint layer forming step, the first groove forming step, and the first conductive layer forming step. In the first imprint layer forming step, the first imprint layer 25, which is the foundation layer, is formed on the surface of the organic EL panel 11. In the first groove forming step, the first conductive layer forming groove 27 is formed by partially depressing the surface of the first imprint layer 25. In the first conductive layer forming step, the first conductive layer 28 is formed in the first conductive layer forming groove 27 in the first imprint layer 25. After that, once the touch panel 20 and the organic EL display device 10 are manufactured through the second imprint layer forming step, the second groove forming step, and the second conductive layer forming step, the second conductive layer 30 is electrically continuously connected directly to the first conductive layer 28 through the second contact hole 38 bored through the second imprint layer 26. Thus, the first conductive layer 28 placed in the first imprint layer 25 can be formed in the appropriate position by using an imprint technique, and the touch panel 20 can be integrally provided on the surface of the organic EL panel 11.

Further, in the first imprint layer forming step of the method for manufacturing an organic EL display device 10, the first imprint layer 25 formed is made of an ultraviolet-curable resin material. This makes manufacturing possible even if the organic EL panel 11 does not have high heat resistance, as compared with the case of a first imprint layer made of a thermosetting resin material.

Further, in the first imprint layer forming step of the method for manufacturing an organic EL display device 10, the organic EL panel 11 on the surface of which the first imprint layer 25 is formed is made of synthetic resin and has flexibility. This makes manufacturing possible with an imprint technique, as the first imprint layer 25 is made of an ultraviolet-curable resin material, although the organic EL panel 11 is lower in heat resistance than an inflexible organic EL panel 11 made of glass. The organic EL panel 11 on a surface of which the touch panel 20 has been placed has sufficient flexibility to be suitable for foldable use.

Further, in the first imprint layer forming step of the method for manufacturing an organic EL display device 10, the first imprint layer 25 is formed so that a first contact hole (foundation contact hole) 37 is bored through a location that overlaps at least a part of a panel-side ground wire 36 of the organic EL panel 11, in the second groove forming step, the first conductive layer forming groove 27 is formed so that at least a part of the first conductive layer forming groove 27 communicates with the first contact hole 37, in the first conductive layer forming step, a first ground wire 34 constituted by the foundation conductive layer is formed in the first conductive layer forming groove 27 and the first contact hole 37, and in the second conductive layer forming step, a second ground wire 35 constituted by the second conductive layer 30 is formed. In this way, in the first imprint layer forming step, the first imprint layer 25 is formed on the surface of the organic EL panel 11, and the first contact hole 37 is bored through a location in the first imprint layer 25 that overlaps at least a part of the panel-side ground wire 36 of the organic EL panel 11. In the second groove forming step, once the first conductive layer forming groove 27 is formed by partially depressing the surface of the first imprint layer 25, at least a part of the first conductive layer forming groove 27 is brought into communication with the first contact hole 37. In the first conductive layer forming step, the first conductive layer 28 is formed in the first conductive layer forming groove 27 and the first contact hole 37 in the first imprint layer 25. The first conductive layer 28 formed in the first conductive layer forming step is electrically continuously connected directly to the panel-side ground wire 36 of the organic EL panel 11 through the first contact hole 37, which communicates with at least a part of the first conductive layer forming groove 27. After that, once the touch panel 20 and the organic EL display device 10 are manufactured through the second imprint layer forming step, the second groove forming step, and the second conductive layer forming step, the second ground wire 35 constituted by the second conductive layer 30 is electrically continuously connected directly to the first ground wire 34 through the second contact hole 38 bored through the second imprint layer 26. The second ground wire 35 is connected to the panel-side ground wire 36 via the first ground wire 34. Since the panel-side ground wire 36, the first ground wire 34, and the second ground wire 35 are wider in line width than a wire that transmits a signal or other wires, the first contact hole 37 and the second contact hole 38, through which the panel-side ground wire 36, the first ground wire 34 and the second ground wire 35 are electrically continuously connected to each other, are sufficiently wide in range of opening in the first imprint layer 25 and the second imprint layer 26, respectively. Accordingly, even if the ranges of opening of the first contact hole 37 and the second contact hole 38 become reduced in forming the first conductive layer forming groove 27 and the second conductive layer forming groove 29 in the first imprint layer 25 and the second imprint layer 26 in the first groove forming step and the second groove forming step, the reliability of a connection between the panel-side ground wire 36, the first ground wire 34, and the second ground wire 35, which are connected to one another through the first contact hole 37 and the second contact hole 38, is sufficiently secured.

Second Embodiment

A second embodiment is described with reference to FIGS. 14A to 15B. The second embodiment illustrates changes made to achieve a configuration of a second imprint block 141. It should be noted that a repeated description of structures, actions, and effects which are similar to those of the first embodiment is omitted.

Figure 14A:
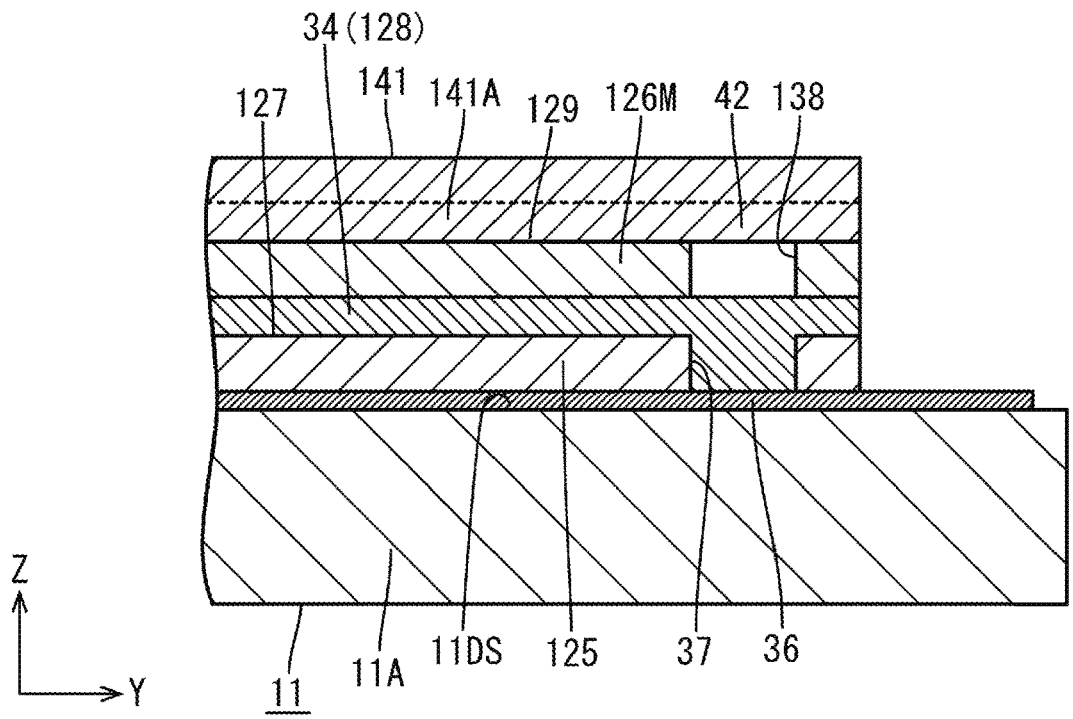
FIG. 14A is a cross-sectional view showing a state where a second imprint block has been pressed onto an uncured second imprint layer in a second groove forming step of a method for manufacturing a touch panel according to a second embodiment.

As shown in FIG. 14A, the second imprint block 141, which is used in a second groove forming step according to the second embodiment, is configured such that a part of a second protrusion 141A for forming a second conductive layer forming groove 129 passes transversely across a second contact hole 138. In particular, a portion of the second protrusion 141A that transfers a portion of the second conductive layer forming groove 129 in which a second ground wire 135 is formed is extended into the second contact hole 138, and the resulting extension portion 42 passes transversely across the second contact hole 138. The extension portion 42 of the second protrusion 141A extends to an end of the second imprint block 141 to form the second conductive layer forming groove 129 to the end of the second imprint block 141. In the second embodiment, the extension portion 42 extends along the Y-axis direction.

Figure 14B:
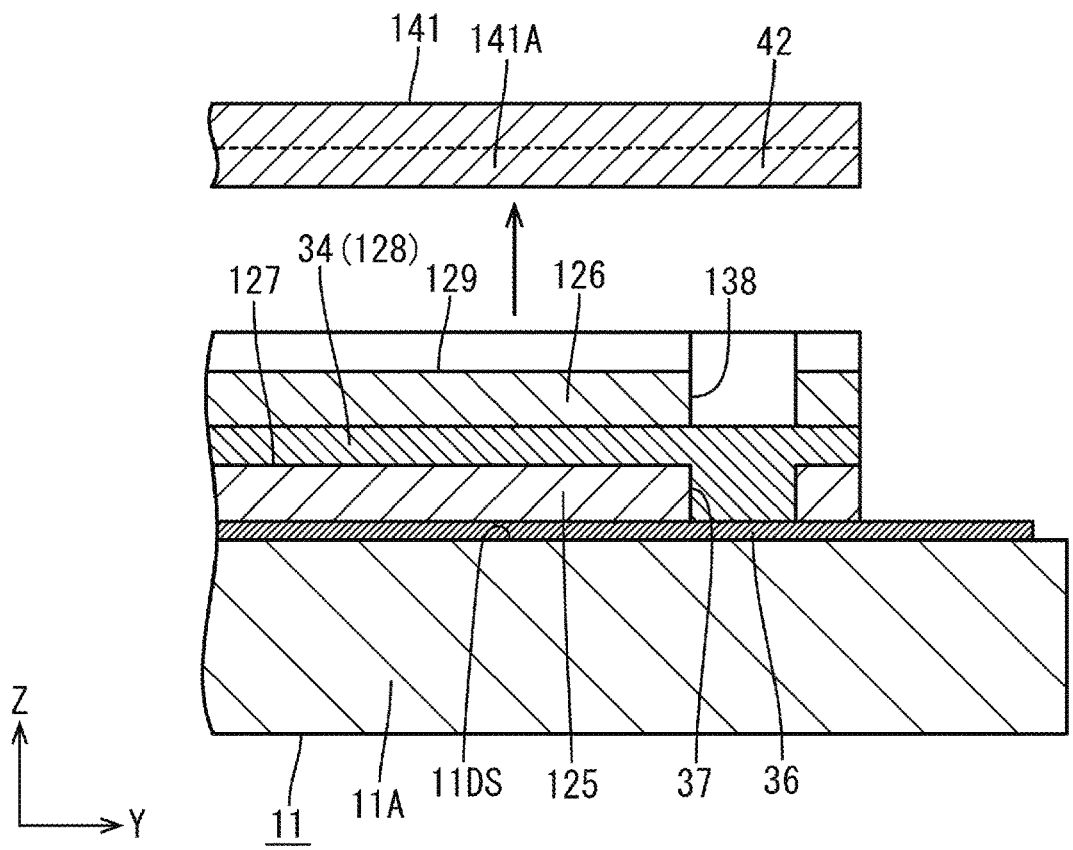
FIG. 14B is a cross-sectional view showing a state where a second conductive layer forming groove has been formed with the second imprint layer cured in the second groove forming step of the method for manufacturing a touch panel.
Figure 15A:
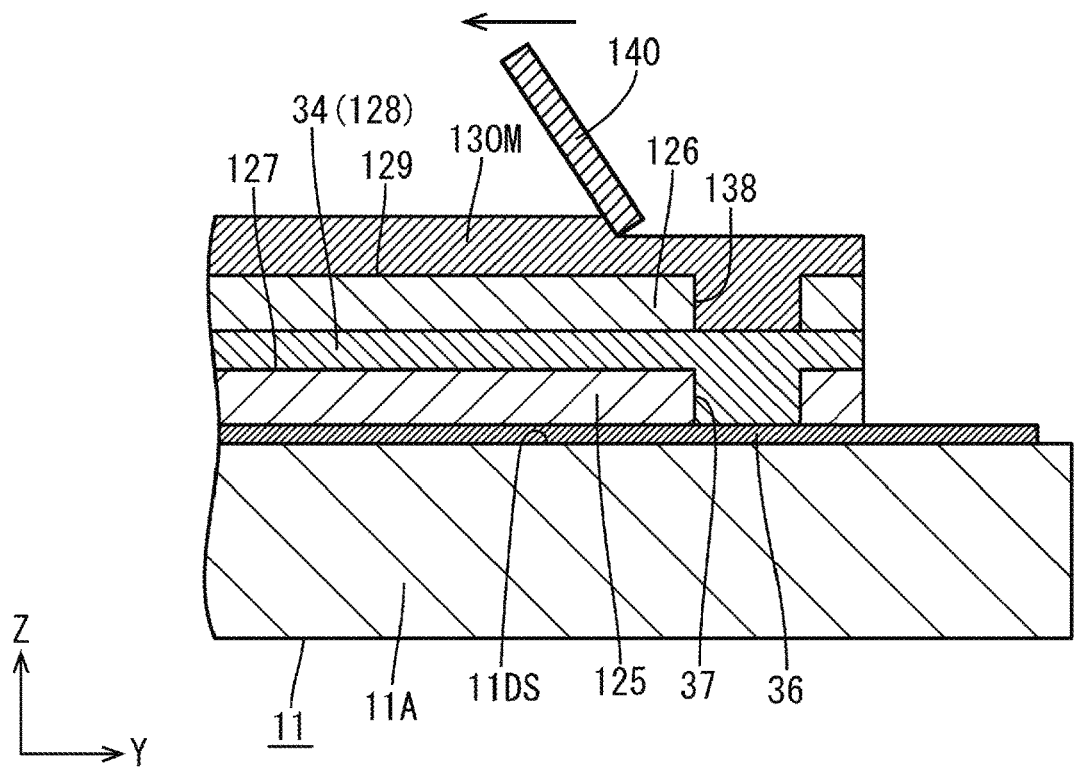
FIG. 15A is a cross-sectional view showings a task of filling the second conductive layer forming groove with a material of a second conductive layer with the squeegee in a second conductive layer forming step of the method for manufacturing a touch panel.
Figure 15B:
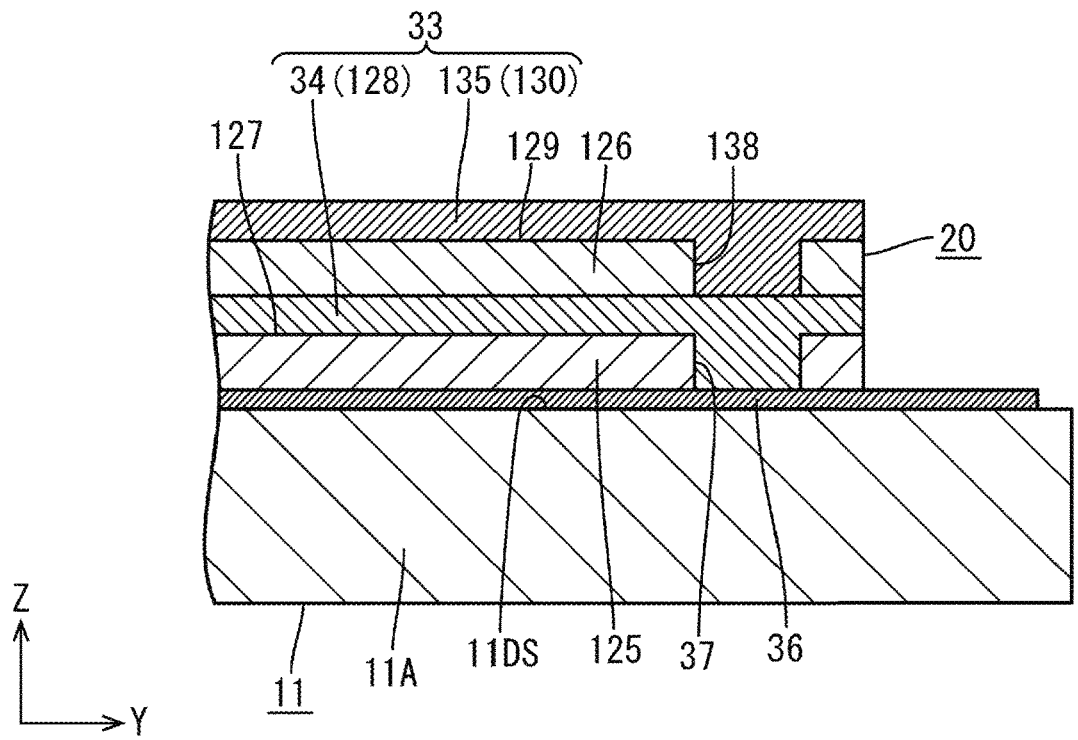
FIG. 15B is a cross-sectional view showing a state where the second conductive layer has been formed in the second conductive layer forming step of the method for manufacturing a touch panel.

Specifically, as shown in FIG. 14A, when the second imprint block 141 is pressed onto a surface of an ultraviolet-curable resin material 126M in an uncured state in the second groove forming step, a second imprint layer 126 comes to have a portion depressed by the second protrusion 141A (including the extension portion 42) being pressed into the portion. At this point in time, even if the second imprint block 141 is slightly misaligned with the second imprint layer 126 in the Y-axis direction (direction of extension of the extension portion 42), the second protrusion 141 is pressed against a peripheral edge of the second contact hole 138 with high certainty, as the extension portion 42 of the second protrusion 141A is placed in such a manner as to pass transversely across the second contact hole 138. Irradiating the second imprint layer 126 with ultraviolet rays in this state causes the second imprint layer 126, which has been in an uncured state, to be completely cured. After that, as shown in FIG. 14B, removing the second imprint block 141 from the second imprint layer 126 causes the second conductive layer forming groove 129 to be formed by the portion of the second imprint layer 126 into which the second protrusion 141A of the second imprint block 141 was pressed. At this point in time, a part of the second conductive layer forming groove 129 communicates with the second contact hole 138 with higher certainty. After that, as shown in FIGS. 15A and 15B, the execution of the second conductive layer forming step causes the second conductive layer forming groove 129 and the second contact hole 138 to be filled with a material 130M of a second conductive layer 130 by a squeegee 140. Through drying by a dryer, the second conductive layer 130 is formed in the second conductive layer forming groove 129 and the second contact hole 138. The second conductive layer 130 formed in the second conductive layer forming groove 129, which communicates with the second contact hole 138 with high certainty, is electrically continuously connected to a first conductive layer 128 through the second contact hole 138 with higher certainty. All this provides superior connection reliability. It should be noted that in the second embodiment, a first groove forming step of forming a first conductive layer forming groove 127 in a surface of a first imprint layer 125 is similar to the aforementioned second groove forming step.

According to the second embodiment, as described above, in the second groove forming step, a second imprint block (imprint block) 141 having a second protrusion (protruding portion) 141A for forming the second conductive layer forming groove 129 is pressed onto the surface of the second imprint layer 126, the second protrusion 141A being placed in such a manner that at least a part of the second protrusion 141A passes transversely across the second contact hole 138. In this way, when the second imprint block 141 is pressed onto the surface of the second imprint layer 126 in the second groove forming step, the second conductive layer forming groove 129 at least a part of which communicates with the second contact hole 138 is formed by the second protrusion 141A partially depressing the surface of the second imprint layer 126. For example, even if the second imprint block 141 is slightly misaligned with the second imprint layer 126, the second protrusion 141A is pressed against a part of peripheral edge of the second contact hole 138 with high certainty, as the second protrusion 141A of the second imprint block 141 is placed in such a manner that at least a part of the second protrusion 141A passes transversely across the second contact hole 138. Accordingly, at least a part of the second conductive layer forming groove 129 communicates with the second contact hole 138 with higher certainty; therefore, the second conductive layer 130 formed in the second conductive layer forming groove 129 is electrically continuously connected to a first conductive layer 128 through the second contact hole 138 with higher certainty. All this provides superior connection reliability.

Other Embodiments

The technology described herein is not limited to the embodiments described above with reference to the drawings. The following embodiments may be included in the technical scope.

(1) Although a case has been illustrated where the first imprint layer and the second imprint layer are printed by the same method in the first imprint layer forming step and the second imprint layer forming step, respectively, the first imprint layer and the second imprint layer may be printed by different methods. For example, in a case where the first imprint layer has been formed by an inkjet printing method (screen printing method), the second imprint layer may be formed by a screen printing method (inkjet printing method).

(2) Alternatively, another printing method may be used, provided the range of application of each imprint layer and the like can be highly accurately controlled.

(3) Alternatively, the ranges of opening of the first contact hole and the second contact hole may be set to be equal to the places of connection in the panel-side ground wire and the first ground wire.

(4) In that case, a contact hole is bored through a place in the single imprint layer where a ground wire placed in the imprint layer and a panel-side ground layer placed on an organic EL panel overlap each other.

(5) Contrary to (4) described above, three or more imprint layers may be stacked.

(6) Alternatively, the objects to be connected through the first contact hole and the second contact hole are subject to change as appropriate. In that case, depending on the objects to be connected, the first contact hole in the first imprint layer may be omitted, or the second contact hole in the second imprint layer may be omitted.

(7) Besides the embodiments described above, specific numerical values such as the thickness of each imprint layer, the thickness of the organic EL panel, and the thickness of the polarizing plate are subject to change as appropriate. Similarly, specific numerical values such as the depth and line width of each conductive layer are subject to change as appropriate. Similarly, a specific numerical value of an outer dimension of each touch electrode is subject to change as appropriate.

(8) Alternatively, it is also possible to apply the technology described herein, for example, by using, as the "substrate" instead of the touch panel, a shielding component for shielding electromagnetic waves from the organic EL panel. Such a shielding component is formed, for example, by routing a conductive layer in a mesh pattern in a manner similar to each of the embodiments described above on a surface of a single-layer imprint layer, and has both translucency and shielding performance. Other than those above, the specific configuration of the shielding component is subject to change as appropriate.

(9) Alternatively, the first conductive layer and the second conductive layer may be laminated structures each formed by joining multiple layers on top of each other. For example, the first conductive layer and the second conductive layer may be laminated structures in each of which a metal layer made of a metal material is placed on a lower level (deeper level) and a light-absorbing conductive layer made of a conductive material that is higher in optical absorptance than the metal layer is placed on an upper level (surface-layer level), and this makes it possible to achieve superior electrical conductivity and enable the light-absorbing conductive layer to provide an outside light reflection suppression function. It should be noted that the specific laminated structures of the first conductive layer and the second conductive layer are not limited to these but are subject to change as appropriate.

(10) Alternatively, it is possible to use gold nanoink, copper nanoink, conductive paste such as silver paste, black fullerene ink, carbon ink, carbon-based material ink, or the like. Furthermore, it is also possible to use hybrid ink prepared by mixing fullerene ink, carbon ink, or carbon-based material ink into metal nanoink.

(11) Alternatively, the first imprint layer and the second imprint layer may be made of different materials. Even in that case, it is preferable that the materials be identical in property (such as ultraviolet curability) to each other and the materials be different in specific name and composition from each other. However, this is not intended to impose any limitation.

(12) Alternatively, the first imprint layer and the second imprint layer may be each made of a visible-light-curable resin material (which is a type of photo-curable resin material that is cured by irradiation with visible light), a thermosetting resin material, a thermoplastic resin material, or the like.

(13) Besides the embodiments described above, it is of course possible to swap the direction of arrangement of first touch electrodes and the direction of arrangement of second touch electrodes.

(14) Alternatively, the planar shape of each of the touch electrodes may be changed as appropriate to a square shape, a circular shape, a polygonal shape with five or more angles, or the like.

(15) Alternatively, the technology described herein is also applicable to a touch panel pattern of a self-capacitance type.

(16) Alternatively, the planar shape of the organic EL display device may be a vertically long square shape or a regular square shape or like may be a non-square shape such as a circular shape or an elliptical trapezoidal shape. Further, the planar shape of the organic EL display device may be a substantially square shape with at least one rounded corner.

(17) Alternatively, the base material of the organic EL panel may be made of glass.

(18) Alternatively, the touch panel may be provided integrally with a device (e.g. a touch pad) other than the display device.

(19) This may be replaced by a liquid crystal display device including a liquid crystal panel as a display panel. Furthermore, the organic EL display device and the liquid crystal display device may be replaced by a quantum-dot display device including a quantum-dot panel as a display panel. The quantum-dot panel utilizes, as a light-emitting layer such as an organic EL layer, a quantum-dot layer composed of quantum dots. It is preferable that the quantum-dot layer be composed, for example, of blue quantum dots that emit blue light, green quantum dots that emit green light, and red quantum dots that emit red light.

The invention claimed is:

1. A method of producing a display device by providing a display panel with a substrate, the method comprising:
    a foundation imprint layer forming step of forming a foundation imprint layer on a surface of the display panel;
    a foundation groove forming step of forming a foundation groove by partially depressing a surface of the foundation imprint layer that will face an imprint layer;
    a foundation conductive layer forming step of forming a foundation conductive layer in the foundation groove;
    an imprint layer forming step of forming the imprint layer on a surface of the foundation imprint layer and boring a contact hole through a location in the imprint layer that overlaps at least a part of the foundation conductive layer of the foundation imprint layer;
    a groove forming step of, by partially depressing a surface of the imprint layer, forming a conductive layer forming groove, at least a part of the conductive layer forming groove communicating with the contact hole; and
    a conductive layer forming step of forming a conductive layer in the conductive layer forming groove and the contact hole.

2. The method of producing a display device according to claim 1, wherein in the imprint layer forming step, the imprint layer is formed by an inkjet printing method or a screen printing method.

3. The method of producing a display device according to claim 1, wherein in the imprint layer forming step, the contact hole is bored so as to have a larger range of opening than a place in the foundation conductive layer that is connected to the conductive layer.

4. The method of producing a display device according to claim 1, wherein in the groove forming step, an imprint block having a protruding portion for forming the conductive layer forming groove is pressed onto the surface of the imprint layer, the protruding portion being placed in such a manner that at least a part of the protruding portion passes transversely across the contact hole.

5. The method of producing a display device according to claim 1, wherein the imprint layer forming step is preceded by
the foundation imprint layer forming step,
the foundation groove forming step, and
the foundation conductive layer forming step.

6. The method of producing a display device according to claim 1, wherein in the foundation imprint layer forming step, the foundation imprint layer is formed by using a printing method which is identical to that used in the imprint layer forming step.

7. The method of producing a display device according to claim 1, wherein in the foundation conductive layer forming step, a first ground wire is formed as the foundation conductive layer, and
in the conductive layer forming step, a second ground wire is formed as the conductive layer.

8. The method of producing a display device according to claim 1, wherein in the conductive layer forming step and the foundation conductive layer forming step, a first position detecting electrode and a second position detecting electrode are formed as at least parts of the foundation conductive layer and the conductive layer, respectively, and the first position detecting electrode and the second position detecting electrode form capacitances with a position inputter that inputs a position, are capable of detecting a position inputted by the position inputter, and do not overlap each other.

9. The method of producing a display device according to claim 1, wherein in the foundation imprint layer forming step, the foundation imprint layer formed is made of an ultraviolet-curable resin material.

10. The method of producing a display device according to claim 9, wherein in the foundation imprint layer forming step, the display panel on the surface of which the foundation imprint layer is formed is made of synthetic resin and has flexibility.

11. The method of producing a display device according to claim 1, wherein in the foundation imprint layer forming step, the foundation imprint layer is formed so that a foundation contact hole is bored through a location that overlaps at least a part of a panel-side ground wire of the display panel,
in the foundation groove forming step, the foundation groove is formed so that at least a part of the foundation groove communicates with the foundation contact hole,
in the foundation conductive layer forming step, a first ground wire constituted by the foundation conductive layer is formed in the foundation groove and the foundation contact hole, and
in the conductive layer forming step, a second ground wire constituted by the conductive layer is formed.

* * * * *